(12) United States Patent
Miyamoto et al.

(10) Patent No.: US 7,559,047 B2
(45) Date of Patent: Jul. 7, 2009

(54) METHOD AND APPARATUS FOR CREATING IMAGING RECIPE

(75) Inventors: Atsushi Miyamoto, Yokohama (JP);
Wataru Nagatomo, Yokohama (JP);
Ryoichi Matsuoka, Yotsukaido (JP);
Hidetoshi Morokuma, Hitachinaka (JP);
Takumichi Sutani, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 226 days.

(21) Appl. No.: 11/342,694

(22) Filed: Jan. 31, 2006

(65) Prior Publication Data

US 2006/0288325 A1    Dec. 21, 2006

(30) Foreign Application Priority Data

Jun. 15, 2005    (JP)    ............................... 2005-174559

(51) Int. Cl.
*G06F 17/50*    (2006.01)
*G06K 9/00*    (2006.01)
(52) U.S. Cl. ....................................... 716/21; 382/144
(58) Field of Classification Search ............. 716/19–21; 382/144
See application file for complete search history.

(56) References Cited

U.S. PATENT DOCUMENTS

| | | | | |
|---|---|---|---|---|
| 5,621,653 | A * | 4/1997 | Yuzawa .......................... | 716/3 |
| 6,016,357 | A * | 1/2000 | Neary et al. ................. | 382/144 |
| 6,581,193 | B1 * | 6/2003 | McGhee et al. ................. | 716/4 |
| 6,691,052 | B1 * | 2/2004 | Maurer ......................... | 702/81 |
| 6,868,175 | B1 * | 3/2005 | Yamamoto et al. .......... | 382/145 |
| 6,886,153 | B1 * | 4/2005 | Bevis ........................... | 716/19 |
| 6,909,930 | B2 * | 6/2005 | Shishido et al. ............. | 700/121 |
| 7,065,239 | B2 * | 6/2006 | Maayah et al. .............. | 382/145 |
| 7,123,356 | B1 * | 10/2006 | Stokowski et al. ........ | 356/237.2 |
| 7,187,796 | B1 * | 3/2007 | Phan et al. ................... | 382/144 |
| 7,269,816 | B2 * | 9/2007 | Bevis .......................... | 716/19 |
| 7,318,214 | B1 * | 1/2008 | Prasad et al. ................... | 716/21 |
| 2003/0237064 | A1 * | 12/2003 | White et al. .................... | 716/5 |
| 2004/0081350 | A1 * | 4/2004 | Kitamura et al. ............ | 382/149 |
| 2004/0181768 | A1 * | 9/2004 | Krukar ......................... | 716/19 |
| 2004/0228515 | A1 * | 11/2004 | Okabe et al. ................. | 382/145 |
| 2005/0146714 | A1 * | 7/2005 | Kitamura et al. .......... | 356/237.2 |
| 2005/0160394 | A1 * | 7/2005 | Bevis .......................... | 716/19 |
| 2005/0226494 | A1 * | 10/2005 | Yamamoto et al. .......... | 382/149 |

(Continued)

FOREIGN PATENT DOCUMENTS

JP    2000-236007    8/2000

(Continued)

*Primary Examiner*—Stacy A Whitmore
(74) *Attorney, Agent, or Firm*—Antonelli, Terry, Stout & Kraus, LLP.

(57) ABSTRACT

In an imaging recipe creating apparatus that uses a scanning electron microscope to create an imaging recipe for SEM observation of a semiconductor pattern, in order that the imaging recipe for measuring the wiring width and other various dimension values of the pattern from an observation image and thus evaluating the shape of the pattern is automatically generated within a minimum time by the analysis using the CAD image obtained by conversion from CAD data, an CAD image creation unit that creates the CAD image by converting the CAD data into an image format includes an image-quantizing width determining section, a brightness information providing section, and a pattern shape deformation processing section; the imaging recipe being created using the CAD image created by the CAD image creation unit.

15 Claims, 25 Drawing Sheets

U.S. PATENT DOCUMENTS

2006/0245636 A1* 11/2006 Kitamura et al. ............. 382/149
2006/0284081 A1* 12/2006 Miyamoto et al. .......... 250/307
2007/0156275 A1*  7/2007 Piper et al. .................. 700/121
2007/0210252 A1*  9/2007 Miyamoto et al. .......... 250/310
2008/0002876 A1*  1/2008 Hiroi et al. .................. 382/144

FOREIGN PATENT DOCUMENTS

JP    2002-328015    11/2002

* cited by examiner

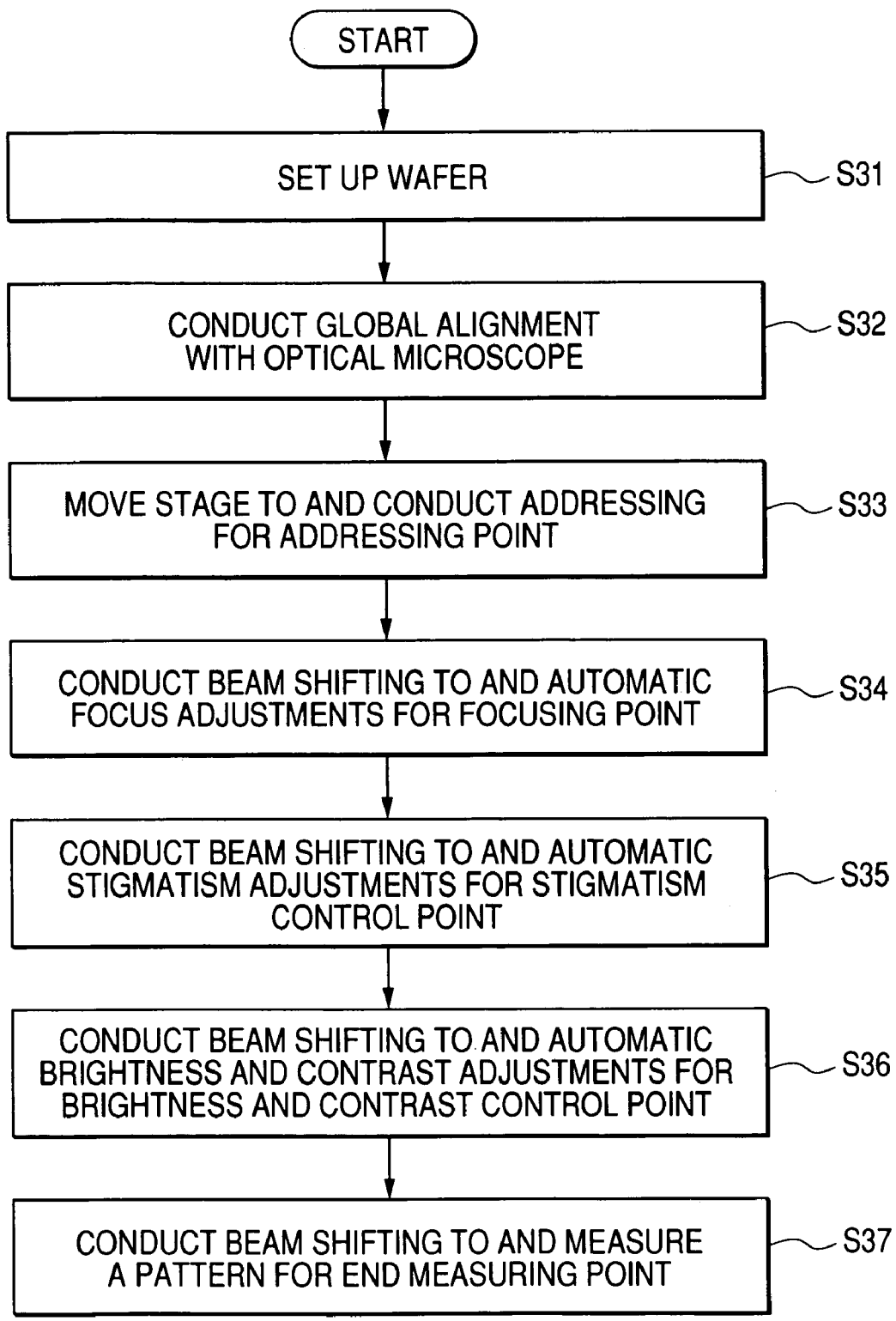

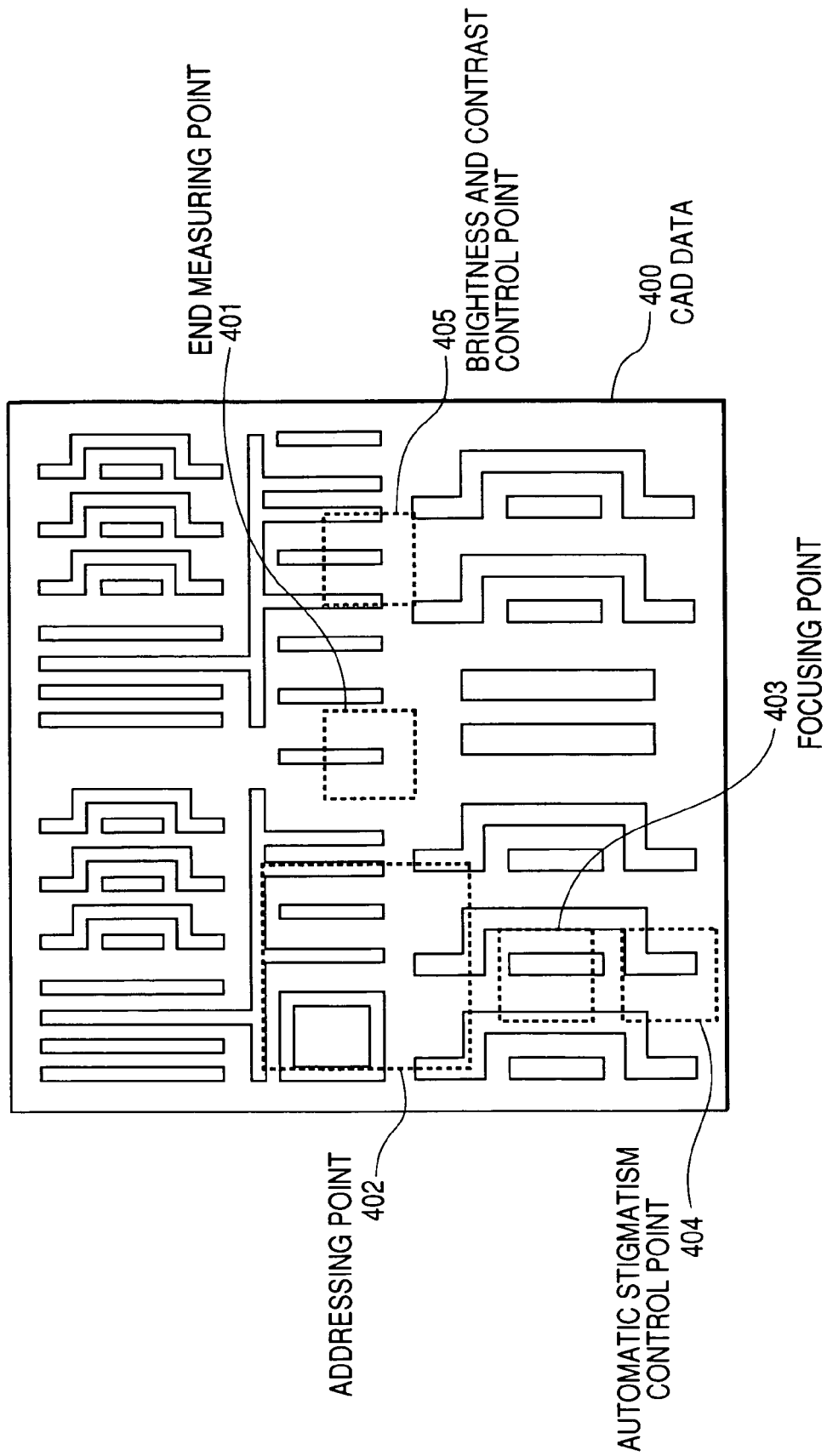

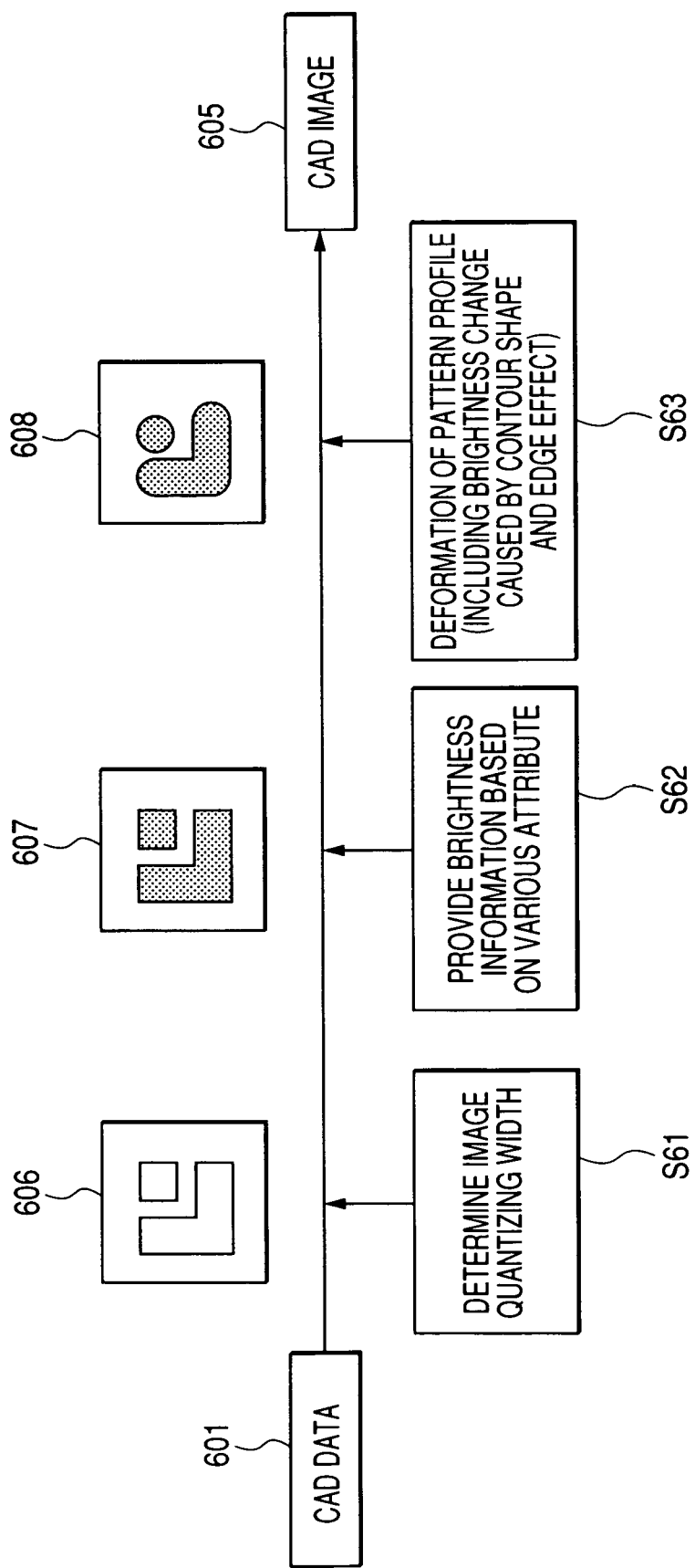

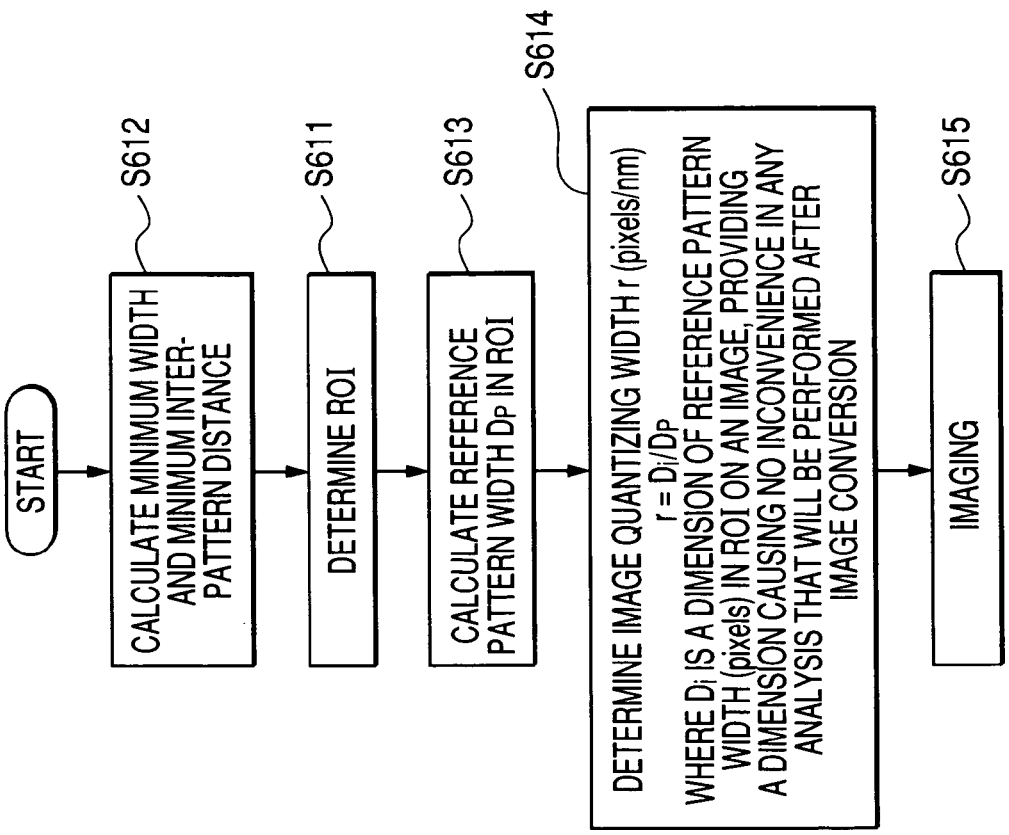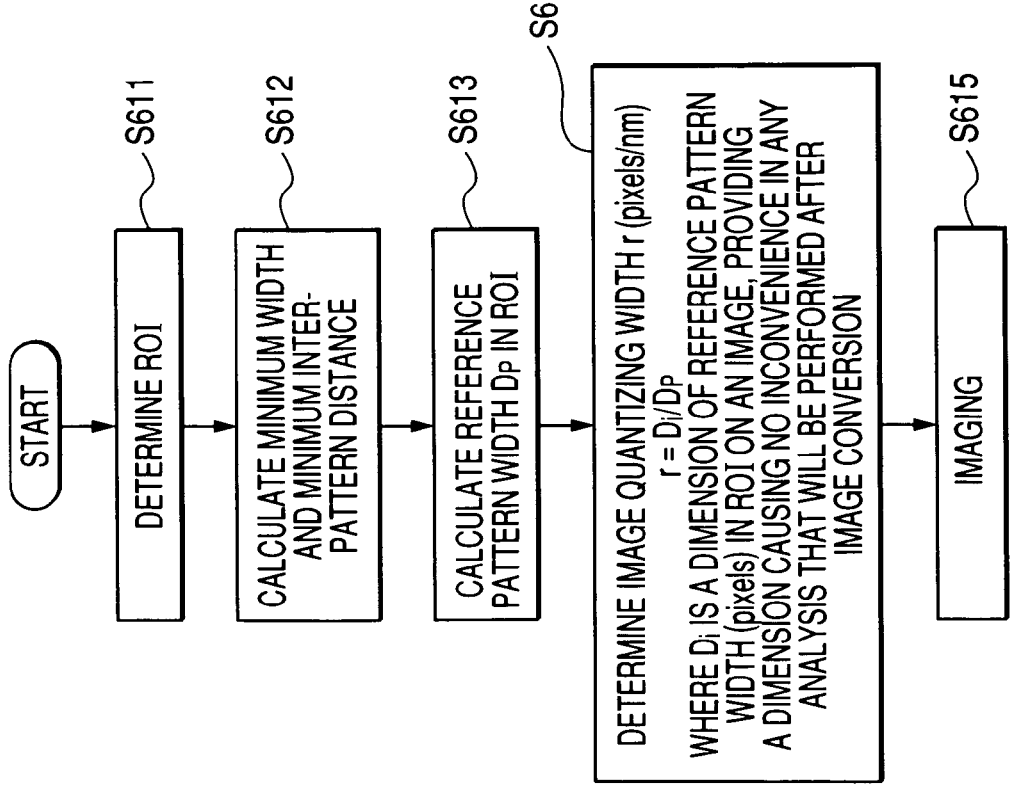

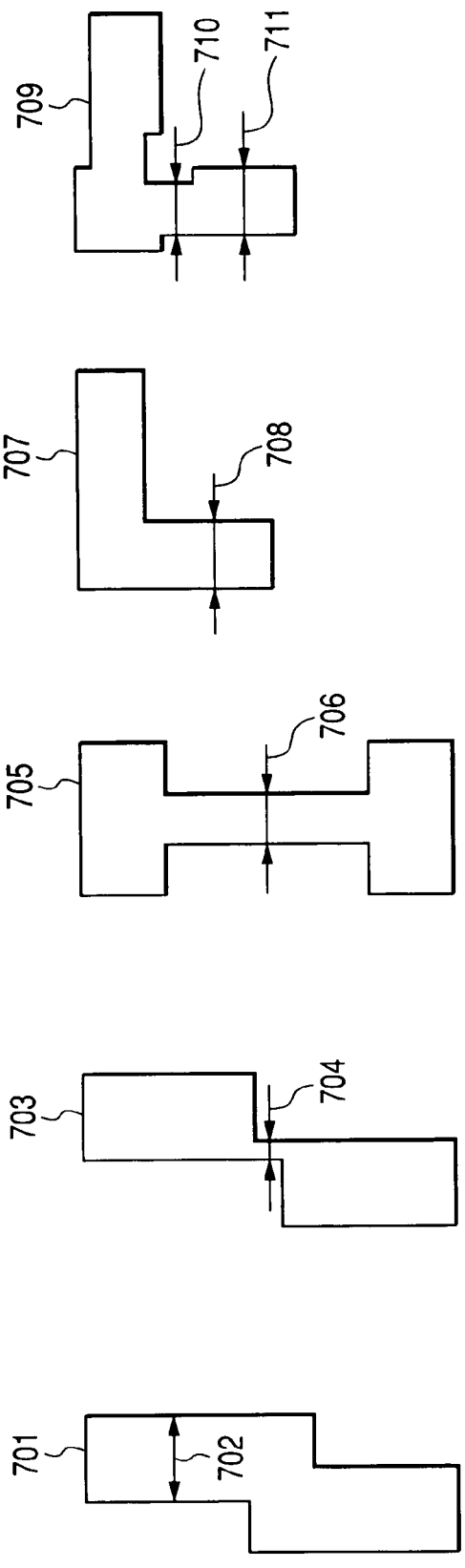

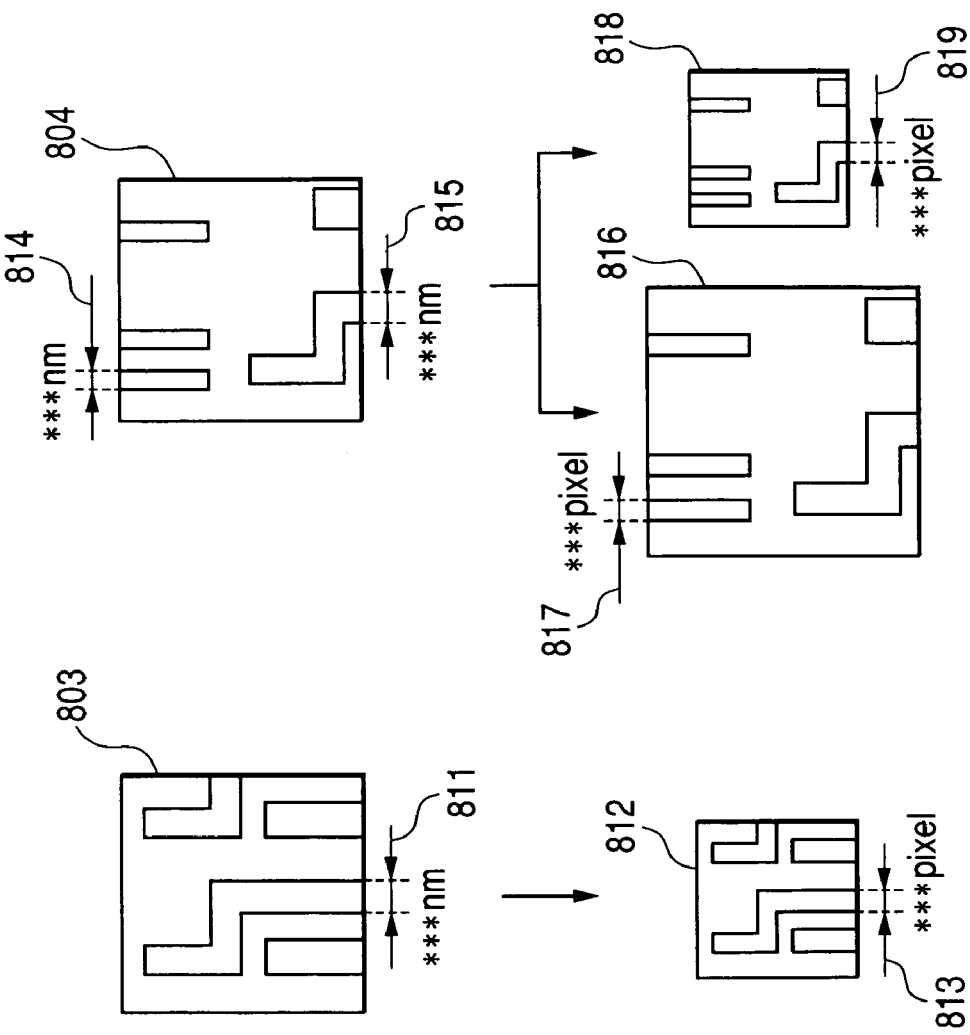

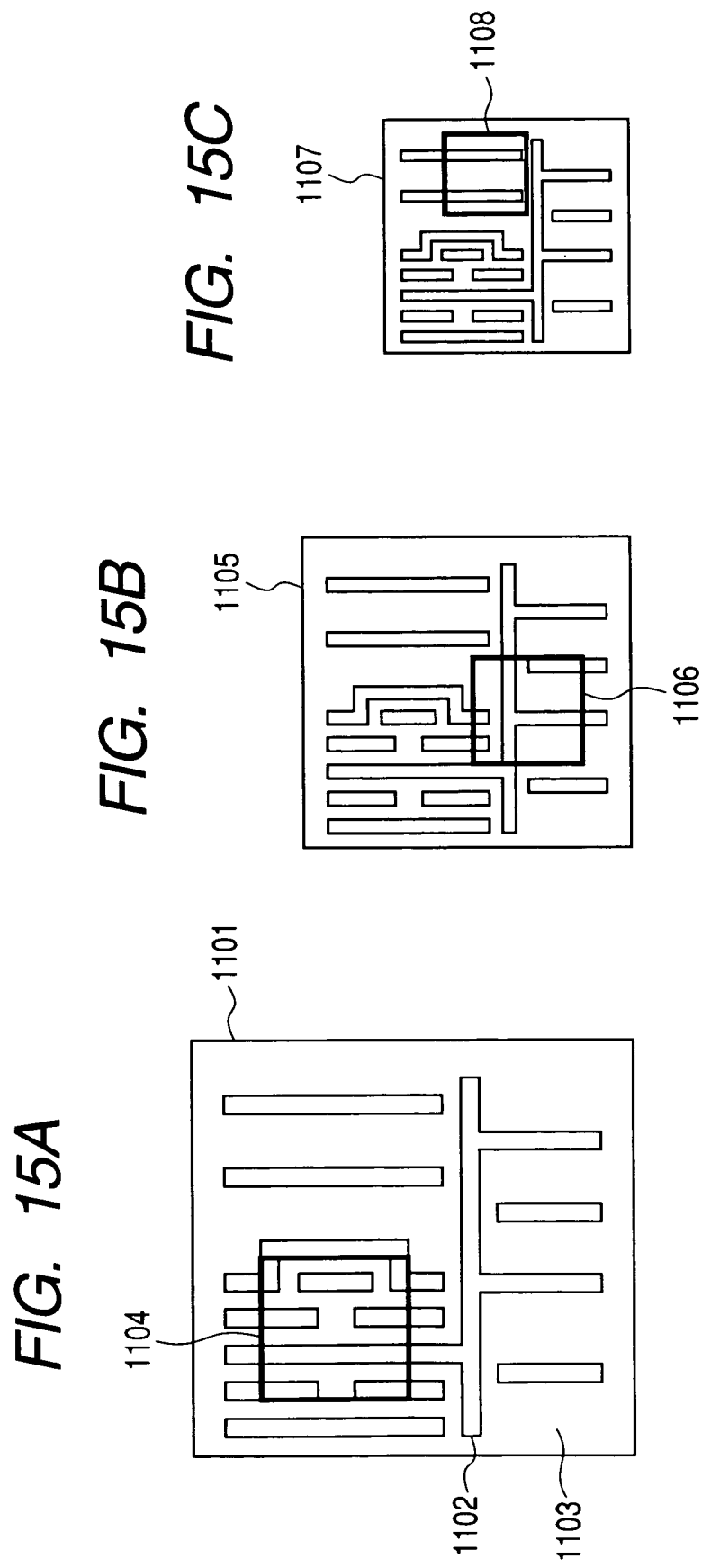

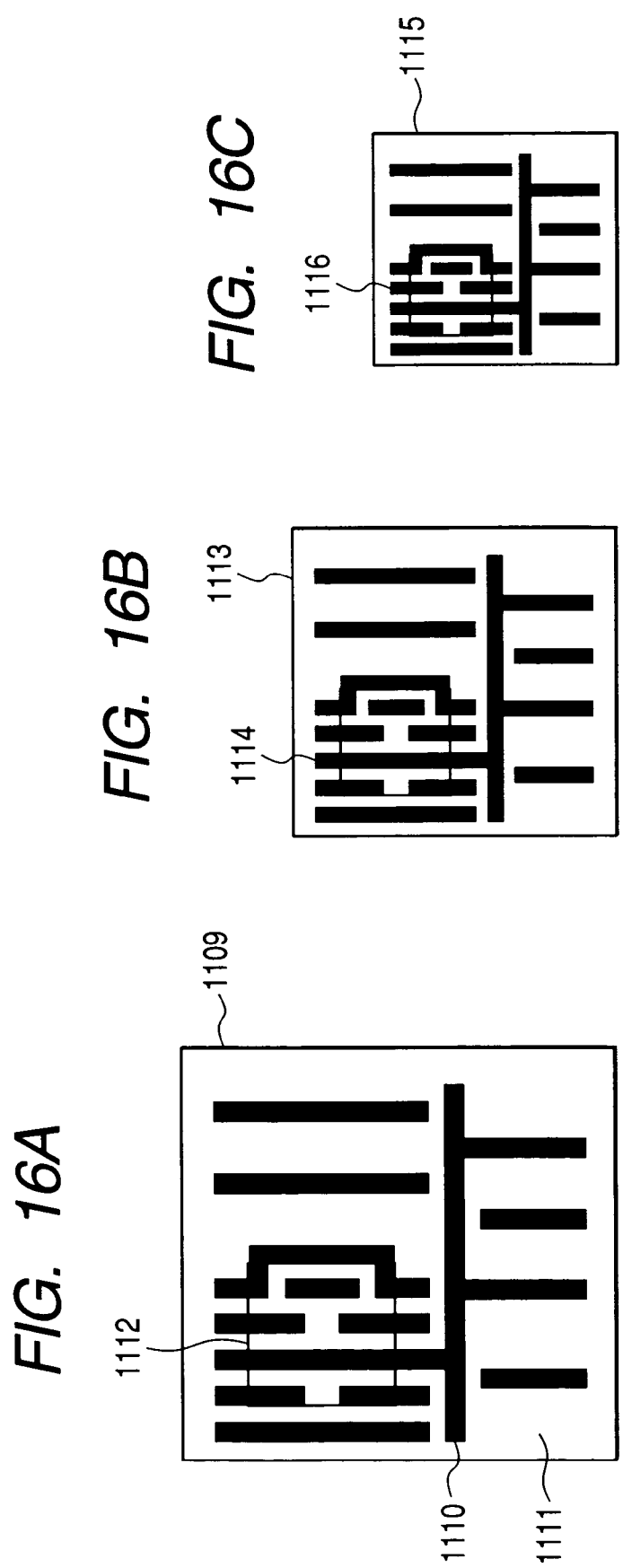

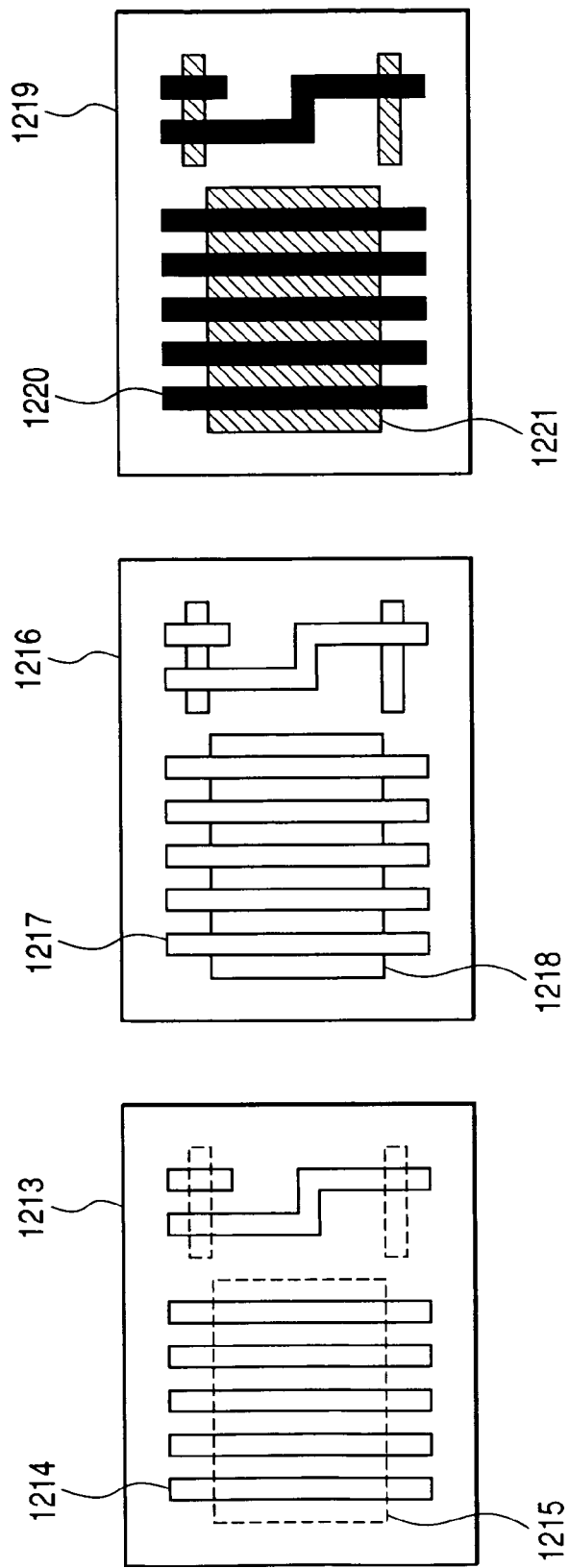

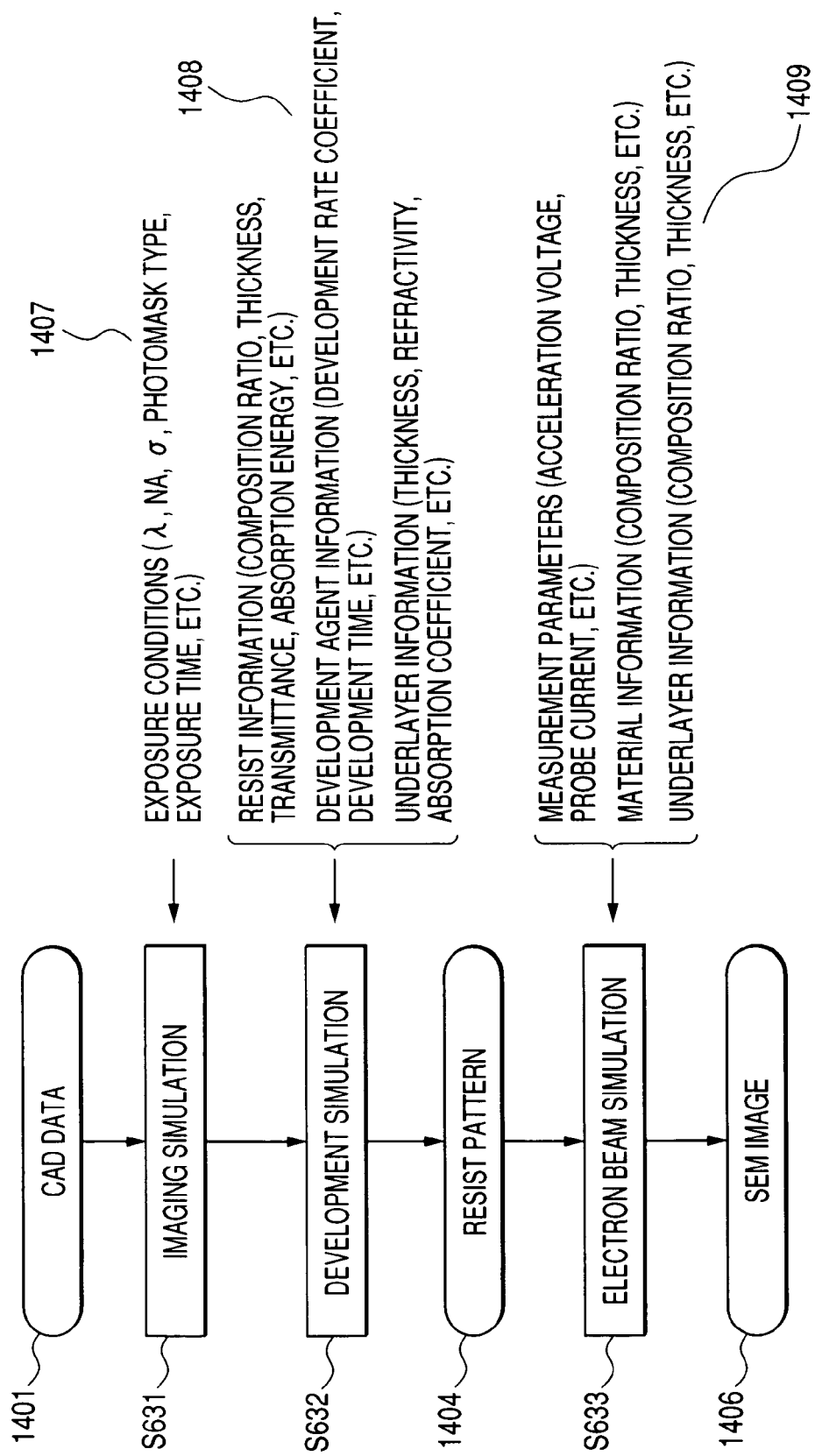

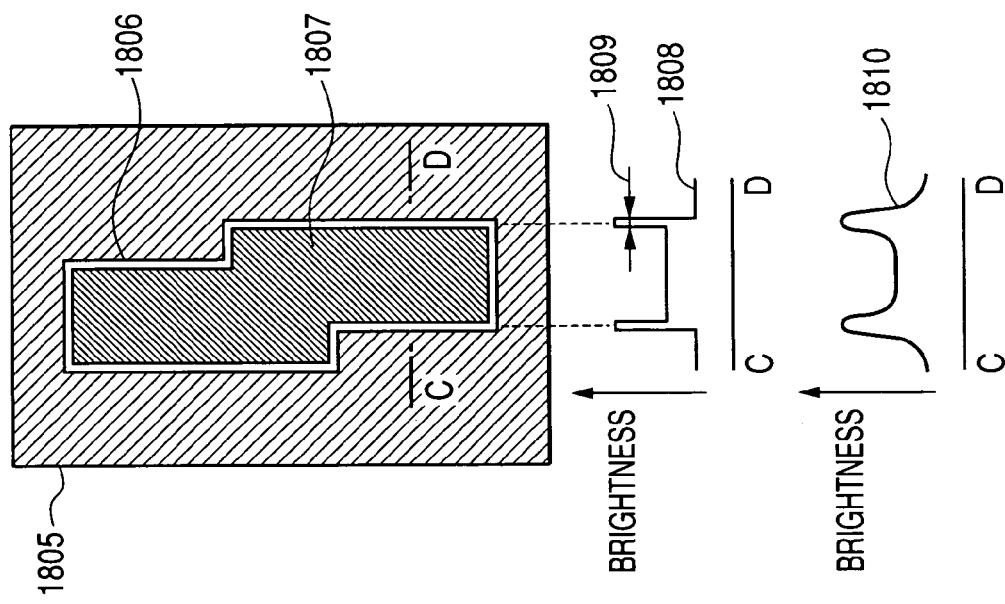
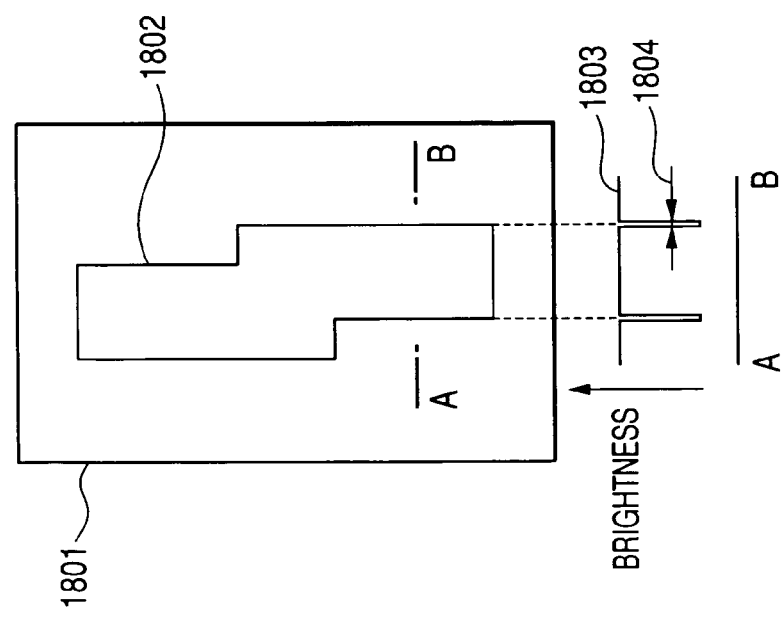

METHOD AND APPARATUS FOR CREATING IMAGING RECIPE

BACKGROUND OF THE INVENTION

The present invention relates to a method and apparatus for creating imaging recipe used to acquire images at any position on a sample with a critical-dimension scanning electron microscope (CD-SEM) or the like. The imaging recipe defines not only coordinates of imaging points of addressing point and evaluation point (end measuring point), but also the image templates or imaging conditions (or the like) that are associated with the above coordinates. The invention is also concerned with an apparatus (SEM apparatus) for evaluating shapes of patterns formed on semiconductor wafers.

Traditionally, CD-SEMs and the like are most commonly used to inspect the workmanship of the highly accurate wiring patterns formed on semiconductor wafers. In SEM apparatuses such as the CD-SEMS, dimensionally critical points on the semiconductor patterns to be inspected are observed as measuring points through the SEM, then various dimensional data on the patterns, such as wiring widths, are measured from the images acquired during the observation process, and the dimensional data is monitored to detect changes in process parameters.

To perform these inspections, it is necessary to create the imaging recipe that defines the coordinates of imaging points, imaging conditions, image templates of each imaging point, and other data.

Japanese Patent Laid-Open Nos. 2002-328015 and 2000-236007 disclose examples of a known technique for creating imaging recipe used with such a SEM apparatus.

Japanese Patent Laid-Open No. 2002-328015 describes a semiconductor inspection system constituted by two subsystems. One is a navigation system that stores CAD data and other design information on a semiconductor wafer and uses the stored design information to set the imaging/inspection conditions including the regions of the semiconductor wafer that are to be inspected. The other is a scanning electron microscopic system that acquires images of the semiconductor wafer in accordance with the set imaging/inspection conditions and is executed inspection of patterns. According to Japanese Patent Laid-Open No. 2002-328015, this semiconductor inspection system also has a function that detects the position of an addressing point (AP) from the CAD data and registers the CAD data of this detected position as a template. In addition, this system has a function that acquires a SEM image associated with the AP, then matches between the acquired SEM image and the registered CAD template at the AP, and after re-registering as another template the SEM image associated with the position of the CAD template, uses the re-registered SEM template subsequently.

Also, Japanese Patent Laid-Open No. 2000-236007 describes a method of creating sequence files for automatic detection with a scanning electron microscope. This file-creating method includes five process steps: acquiring design data from CAD data; acquiring pattern data of any region from the design data; extracting pattern contour edge data on the basis of the pattern data; specifying from the pattern outline edge data the sections to be measured; and setting template edge data from the pattern outline edge data associated with the specified sections.

For the semiconductor inspection system described in Japanese Patent Laid-Open No. 2002-328015, however, a linear image created from the CAD data (for example, an image on which only the boundary of a mask for forming pattern on a resist is represented as edges) is used to determine imaging points manually or automatically. Therefore, there has been the problem that appropriate imaging points cannot be selected because of a significant difference in visual or apparent position between the above linear image and an actual SEM image.

Also, using the method based on optical simulation or resist shape simulation, described in Japanese Patent Laid-Open No. 2000-236007, requires setting resist information (atomic composition ratio, film thickness, negative/positive attribute, light transmittance, light absorption energy, and others), the optical constants (wavelength, numerical aperture, s, the kind of mask, and others) of the light exposure apparatus used, developing agent information (composition, developing rate coefficient, developing time, and others), and other various simulation parameters. In addition, these simulation parameters are not easy to set. Furthermore, the simulation parameters could include those which vary according to the particular position on the wafer surface or a particular time.

SUMMARY OF THE INVENTION

The present invention relates to an apparatus and method designed to create an imaging recipe (including: coordinates of imaging points, imaging conditions, and image template information) for evaluating shapes of patterns by measuring electrical wiring widths and other various dimension values of the patterns from observation images. In the above apparatus and method, analysis using CAD images converted from CAD data can create (generate) the imaging recipe automatically and within a minimum time.

The present invention relates to an apparatus and method for evaluating shapes of patterns formed on semiconductor wafers. In the apparatus and method, a SEM apparatus (or the like) with an imaging recipe creation device can be used to measure at high speed and accurately a large number of sections to be inspected, estimate semiconductor device characteristics and manufacturing process states, and feed back measurement and estimation results into various manufacturing processes.

More specifically, an aspect of the present invention is an imaging recipe creation apparatus and method for creating an imaging recipe for SEM-based observation of semiconductor patterns by use of a scanning electron microscope. The above apparatus and method comprise a CAD data file which obtains by receiving and storing CAD data that contains layout information of the above semiconductor patterns, and a CAD image creation unit which creates CAD images by converting the stored CAD data within the CAD data file into image form. The apparatus and method are designed so as to create the imaging recipe by using the CAD images that have been created by the CAD image creation unit.

In addition, the CAD image creation unit in the above aspect of the present invention includes an image-quantizing width determination section which creates the above CAD images by converting the above CAD data into image form by use of the image-quantizing width determined from the CAD data on the basis of reference pattern width to be noted. In the image-quantizing width determination section, the reference pattern width to be noted includes a minimum line width or minimum inter-pattern distance of the semiconductor patterns to be noted. Furthermore, the CAD image-creation unit in the above aspect of the present invention is constructed so that the minimum line width or minimum inter-pattern distance of the semiconductor patterns is either calculated from the CAD data automatically, assigned by a user, or calculated from the CAD data automatically on the basis of user-set parameters (conditions). Besides, the above reference pattern width has its value specified in a header (or the like) of the CAD data or displayed in GUI (Graphic User Interface) screen mode. Moreover, if the reference pattern width differs between the CAD data regions extracted, the CAD data is converted into image form with image-quantizing widths different for each of the extracted CAD data regions. Determining image-quantizing widths in this way prevents an image size from becoming redundant and makes it possible to generate the CAD images that have held a pattern structure to be noted.

Another aspect of the present invention is a semiconductor pattern shape evaluation apparatus that conducts SEM-based observations on a semiconductor pattern formed on a semiconductor wafer in accordance with an imaging recipe by using a scanning electron microscope and evaluates a shape and dimensions of the semiconductor pattern on the basis of the SEM-based observations. The semiconductor pattern shape evaluation apparatus includes an imaging recipe creation device that creates the imaging recipe for the SEM-based observations mentioned above.

According to the present invention, automatic determination of imaging points (including a part or all of an addressing point, focusing point, stigmatism control point, brightness and contrast control point, or end measuring point) or the like from the CAD image is possible by using a CAD image that has been created based on image-quantizing width, assigned brightness, geometrical deformation, and/or the like, for which reason, the imaging creation that has conventionally been manually conducted can be implemented more easily and at higher speed.

According to the present invention, during actual observation of imaging points through a SEM, it is also possible to match a CAD image (template) whose coordinates are known and a SEM image very accurately, and consequently to evaluate a shape and dimensions of a pattern very accurately.

These and other objects, features, and advantages of the invention will be apparent from the following more particular description of preferred embodiments of the invention, as illustrated in the accompanying drawings.

BRIEF DESCRIPTION OF THE DRAWINGS

FIG. 3 is a diagram showing an example of an imaging sequence in the SEM apparatus according to the present invention;

FIG. 4 is a diagram of the CAD data showing various imaging positions in a low-magnification image according to the present invention;

FIG. 6 is a diagram showing an example of a total process flow in a CAD image-creating unit according to the present invention;

FIG. 7A is a diagram showing a process flow for determining a quantizing width of an image after extracting a ROI, and FIG. 7B is a diagram showing a process flow for calculating reference pattern width and determining a quantizing width of an image before extracting a ROI;

FIG. 8A is a diagram showing a semiconductor pattern shape, FIG. 8B is a diagram showing another semiconductor pattern shape, FIG. 8C is a diagram showing yet another semiconductor pattern shape, FIG. 8D is a diagram showing a shape of a pattern to be formed on a wafer, and FIG. 8E is a diagram showing the pattern shape derived by optical proximity correction of CAD data;

FIG. 13B is a diagram showing a CAD image of a ROI created from CAD data, FIG. 13C is a diagram showing a case in which a width 811 of a reference pattern on a CAD image of a ROI created from CAD data is greater than a width 808 of the reference pattern in FIG. 13B, and FIG. 13D is a diagram showing a CAD image formed so that a width of a reference pattern becomes a pixel size;

FIG. 15A is a diagram showing a CAD image of a mask pattern, FIG. 15B is a diagram showing a CAD image of the same mask pattern as that of FIG. 15A, but different in image-quantizing width, and FIG. 15C is a diagram showing a CAD image of the same mask pattern as that of FIG. 15A, but different from the CAD images of FIGS. 15A and 15B in terms of image-quantizing width;

FIG. 16A is a diagram showing an example of CAD image generation in which information on partial mask removal is used as attribute information, the diagram representing a binary image of a pattern color-coded in accordance with the partial mask removal information, FIG. 16B is a diagram showing a binary image of the same mask pattern as that of FIG. 16A, but different in image-quantizing width, and FIG. 16C is a diagram showing a binary image of the same mask pattern as that of FIG. 16A, but different from the binary images of FIGS. 16A and 16B in terms of image-quantizing width;

FIG. 18A is a diagram showing a CAD image with two layers displayed in overlapped form, FIG. 18B is a diagram showing a case in which a boundary of the patterns observed on a SEM image is extracted from a positional relationship between the upper and lower layers on the CAD image, and FIG. 18C is a diagram showing a CAD image on which patterns present on layers are color-coded for each layer;

FIG. 20 is a diagram showing an example of a process flow for simulating a pattern shape actually generated from CAD data (mask data) in a pattern shape-deforming unit according to the present invention;

FIG. 24A shows a CAD image with a pattern depicted by line drawing, and FIG. 24B shows a CAD image drawn allowing for an edge effect of a boundary of a pattern;

DESCRIPTION OF THE PREFERRED EMBODIMENTS

Embodiments of a SEM apparatus with an imaging recipe creation function according to the present invention, namely, a semiconductor pattern shape evaluation apparatus using a scanning electron microscope such as a critical-dimension scanning electron microscope (CD-SEM), will be described hereunder using FIGS. 1 to 25.

Factors such as decreases in design margins, coupled with further fineness and high density of LSI patterns, are substantially increasing the number of sections to be inspected to dimensionally manage semiconductor patterns. These tendencies are bringing about a strong demand for the improvement of the throughputs and automation ratios of the SEM apparatuses and other apparatuses used as dimensional management tools.

To use a SEM apparatus (or the like) to observe measuring points as dimensionally critical points on the semiconductor patterns to be inspected, and evaluate the shapes of these patterns by measuring the wiring widths and other various dimensions of the patterns from associated observation images, it is necessary to determine the coordinates of the imaging points including a part or all of an addressing point (AP), a focusing point (FP), a stigmatism control point (a stigmatic point) (SP), a brightness/contrast control point (BP), and an evaluation point (an end measuring point) (EP). It is also necessary to determine imaging conditions (an imaging magnification coefficient and other factors related to image quality, such as an electron beam dose rate, focus, and stigmatism). In addition, image templates at each imaging point must be registered. Information of the coordinates of each imaging point, information of the imaging conditions, and information of image template are collectively called an imaging recipe.

In order to effectively utilize the semiconductor pattern design data managed as CAD data, the present invention creates an imaging recipe automatically or within a minimum time by appropriately converting the CAD data into image data and conducting analyses using the CAD images obtained by the conversion. Consequently, the use of the SEM apparatus or the like makes that it possible to measure at high speed and accurately a large number of sections to be inspected, estimate semiconductor device characteristics and manufacturing process states, and feed back measurement and estimation results into various process data.

1: SEM Apparatus (Semiconductor Pattern Shape Evaluation Apparatus Using a Scanning Electron Microscope)

1.1: SEM Apparatus Configuration

Figure 1:
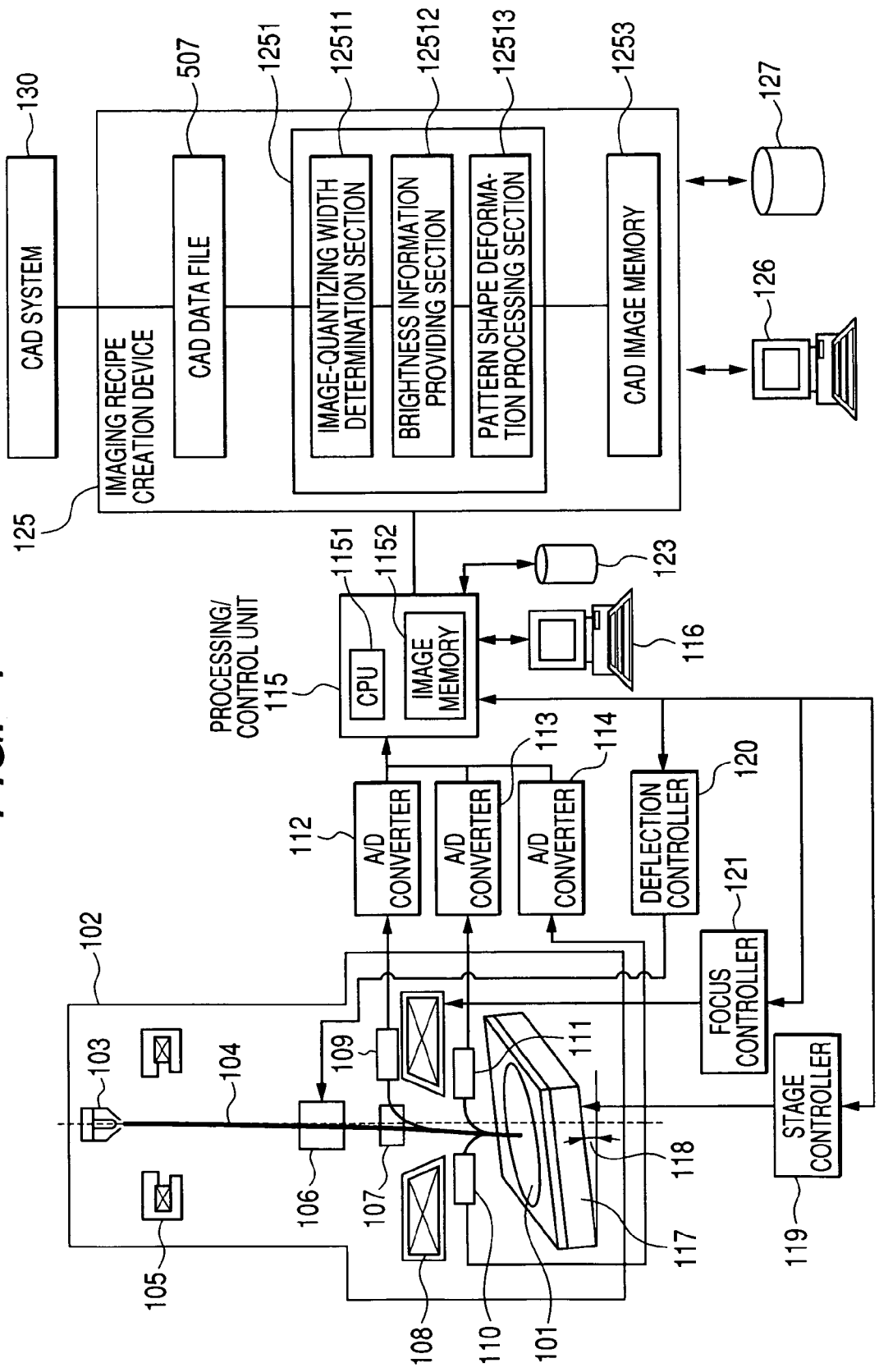
FIG. 1 is a schematic block diagram showing an embodiment of a SEM apparatus according to the present invention.

FIG. 1 is a schematic block diagram of a scanning electron microscope (SEM) which acquires a secondary electron image (SE image) or backscattered electron image (BSE image) of a sample in the present invention. The SE image and the BSE image are collectively called a SEM image. Also, the image acquired here includes a part or all of either a top-down image of an object-under-measurement when the object is observed from a vertical direction, or a tilt image of the object when observed from any oblique direction.

An electron optical system 102 includes an electron gun 103 that generates an electron beam (primary electron) 104, a condenser lens 105 that converges the electron beam 104 generated from the electron gun 103, a deflector 106 that deflects the converged electron beam 104, an ExB deflector 107 that detects a secondary electron, and an objective lens 108 that forms an image of the sample (semiconductor wafer) 101 on the surface thereof by acquiring the converged electron beam. Sample 101 is rested on an XY stage 117. The deflector 106 and the objective lens 108 then work together to control an irradiation position and aperture stop of the electron beam such that any position on the sample 101 rested on the stage 117 will be irradiated with the electron beam in a focused condition thereof. The XY stage 117 moves the sample 101 and enables an image of the sample at any position thereon to be acquired. Changing an observing position by moving the XY stage 117 is called "stage shifting", and changing the observing position by deflecting the electron beam via the deflector 106 is called "beam shifting."

In the meantime, a secondary electron and backscattered electrons are emitted from the sample 101 that has been irradiated with an electron beam. The secondary electron is detected by a secondary electron detector 109, whereas the backscattered electrons are detected by backscattered electron detectors 110, 111. The backscattered electron detectors 110 and 111 are installed to face in directions different from each other. The secondary electron and backscattered electrons that have been detected by the secondary electron detector 109 and the backscattered electron detectors 110, 111, respectively, are each converted into digital signal form by A/D converters 112, 113, 114. These digital signals, after being input to a processing/control unit 115 and stored into an image memory 1152, are sent to a CPU 1151 to undergo image processing appropriate for particular needs. The CPU 1151 executes processing shown in FIG. 3, for example, to measure various dimension values of a pattern, such as wiring width, and monitor these dimension values to detect changes in process parameters. Geometry of the semiconductor pattern, including the above dimensions, is thus evaluated.

To acquire (image) AP, FP, SP, BP, or EP based on imaging recipes created by an imaging recipe creation device 125, the processing/control unit (computer system) 115 sends a control signal to a stage controller 119 and/or a deflection controller 120 and evaluates the geometry of the semiconductor pattern by conducting various types of image processing and control operations on an observation image of the sample 101. Also, the processing/control unit 115 is connected to the stage controller 119 that observes a global alignment mark on the wafer 101 via an optical microscope (not shown) and controls a position and movement of the stage 117. The control of the stage position and movement includes the global alignment control conducted to compensate for any deviations of the wafer 101 from a home position thereof and for any rotational errors of the wafer. The processing/control unit 115 is also connected to the deflection controller 120 that controls electron beam shifting (beam deflection) by controlling the deflector 106, and to a focus controller 121 that controls focus by controlling the objective lens 108. Additionally, the processing/control unit 115 is connected to a display unit 116 having an input device, and thus has functions such as a graphic user interface (GUI) to display images and others to a user.

Although an example of a SEM apparatus configuration with two backscattered electron image detectors is shown in FIG. 1, this number of backscattered electron image detectors can be either reduced or increased. Also, part or all of the above-mentioned processing and control functions of the computer system 115 can be allocated to a plurality of different processing terminals to provide required processing and control.

Several methods are usable to obtain a tilt image of an object to be measured, namely, an image of the object when observed from any oblique direction, by using the apparatus shown in FIG. 1. Examples of these methods include the following:

(1) Scheme for forming an inclined image by deflecting an irradiated electron beam via an electron optical system and inclining an irradiation angle of the electron beam, as described in, for example, Japanese Patent Laid-Open No. 2000-348658

(2) Scheme by inclining the stage 117 itself that moves a semiconductor wafer 101 (in FIG. 1, the stage is inclined at a tilt angle 118)

(3) Scheme by mechanically inclining the electron optical system itself.

The processing/control unit 115 is further connected to an imaging recipe creation device 125 via a network, a bus, or the like. The imaging recipe creation device 125 creates imaging recipes, each of which defines coordinates of the imaging points including either an addressing point (AP), a focusing point (FP), a stigmatism control point (SP), a brightness/contrast control point (BP), or an evaluation point (an end measuring point) (EP), or a plurality or all thereof. Each imaging recipe also includes imaging templates of the above coordinates, imaging conditions (an imaging magnification coefficient and other factors related to image quality), and other information. The imaging recipe creation device 125 is connected to a CAD system 130 via the network or the like in order to acquire CAD data.

The imaging recipe creation device 125 includes a CAD data file 507 for storing CAD data, a CPU (CAD image creation unit) 1251 having an image-quantizing width determination section 12511, a brightness information providing section 12512, and a pattern shape deformation processing section 12513, and a CAD image memory 1253 for storing the CAD images created by the CPU 1251. The image-quantizing width determination section 12511, the brightness information providing section 12512, and the pattern shape deformation processing section 12513 may use programs to execute respective processing. The imaging recipe creation device 125 includes an imaging recipe creation unit which creates an imaging recipe by using a CAD image created by the CAD image creation unit 1251. Additionally, the imaging recipe creation device 125 is connected to a display unit 126 having an input device, and thus has functions such as a GUI to display images and others to the user. Furthermore, the imaging recipe creation device 125 is connected to a storage device 127 for storing various data.

Figure 2A:
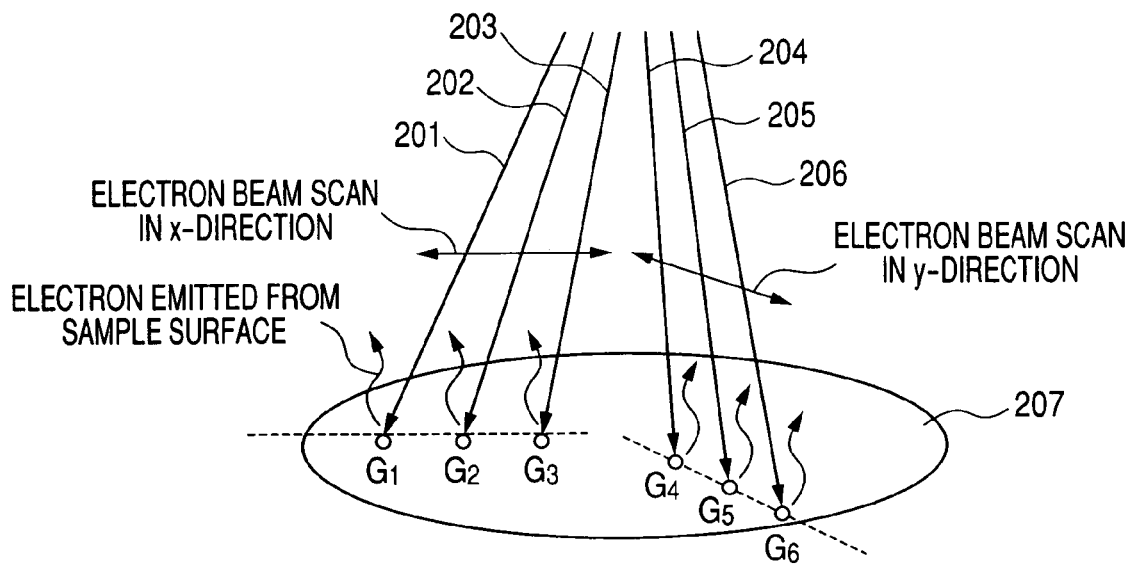
FIG. 2A is a perspective view schematically showing a state of the electrons emitted from the surface of a semiconductor wafer when the wafer surface is scanned with focused electron beams in the SEM apparatus.
Figure 2B:
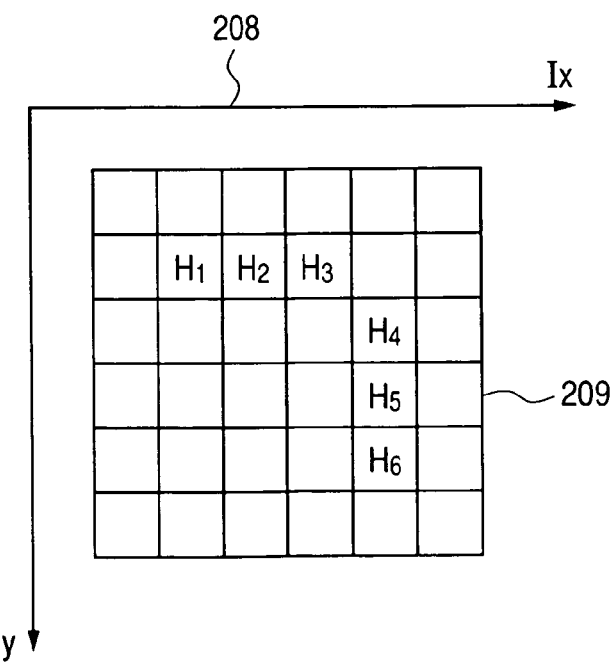
FIG. 2B is a diagram showing a method of converting into image form the signal quantities obtained by detecting the electrons emitted from the semiconductor wafer surface.

Next, a method in which, when the surface of the semiconductor wafer is scanned with electron beams and irradiated therewith, signal quantities of the electrons emitted from the semiconductor wafer surface are converted into image form, will be described using FIGS. 2A and 2B. For example, the electron beams are, as shown in FIG. 2A, irradiated as beams 201-203 or 204-206 to conduct scans in x- and y-directions. Changing a deflecting direction of the electron beams enables a scanning direction to be changed. Three locations on the semiconductor wafer that has been irradiated with the electron beams 201-203 in the x-direction are denoted as $G_1$ to $G_3$, respectively. Similarly, three locations on the semiconductor wafer that has been irradiated with the electron beams 204-206 in the y-direction are denoted as $G_4$ to $G_6$, respectively. The signal quantities of the emitted electrons at the locations $G_1$ to $G_6$ are expressed as brightness values of pixels $H_1$ to $H_6$ within the image 209 shown in FIG. 2B. Subscripts 1 to 6 at lower right portions of the locations G are associated with subscripts 1 to 6, respectively, assigned to the locations G, H. Reference number 208 is a coordinate system (Ix, Iy) that denotes the x- and y-directions on image I.

1.2: SEM Imaging Sequence

Next, an imaging sequence for observing any evaluation point (end measuring point) (EP) will be described using FIG. 3. A section to be imaged in the imaging sequence, and imaging conditions to be used therein (i.e., an imaging magnification coefficient and other data related to image quality), and evaluation conditions at EP are created as an imaging recipe by the imaging recipe creation device 125. After being created, the imaging recipe is stored into, for example, a storage device 123 and managed properly.

First, sample 101 is set up on the stage 117 of the SEM apparatus in step S31. Next, in step S32, the processing/control unit 115 calculates a deviation of the sample from a home position thereof and a rotational deviation of the sample by observing the global alignment mark on the wafer through an optical microscope (not shown), and conducts corrections by controlling the stage 117 via the stage controller 119 on the basis of those deviations. In step S33, the processing/control unit 115 moves the imaging position to an addressing point (AP) in accordance with the imaging conditions and coordinates of the imaging point, created by the imaging recipe creation device 125, by moving the stage 117, and acquires an image using lower-magnification imaging conditions than those of EP (end measuring point).

A supplementary description of AP is given here. For direct observation of EP, in order to solve the problem that the associated section to be observed may become disturbed for reasons of stage-positioning accuracy and the like, the processing/control unit 115 first observes AP whose coordinates created by the imaging recipe creation device 125 beforehand for pre-positioning and registered in the storage device 123, for example, are known. Next, the processing/control unit 115 conducts position matching between an image template at the AP previously created by the imaging recipe creation device 125 and stored into, for example, the storage device 123, and a SEM image at the above-observed AP. The processing/control unit 115 thus detects the vector denoting a deviation between central coordinates of the image template and those of the AP when this point is actually observed. Next, the processing/control unit 115 subtracts the above-detected deviation vector from a relative vector between the coordinates of the image template and those of EP, and then controls the deflector 106 via the deflection controller 120 according to the difference vector subtracted. This control operation moves the imaging position by beam shifting (beam incident direction is tilted to change an irradiation position) to enable the observation of EP, whereby EP can be imaged with high coordinate accuracy (in general, positioning accuracy by beam shifting is higher than the positioning accuracy of the stage).

Therefore, the AP created by the imaging recipe creation device 125 and stored into, for example, the storage device 123, should desirably satisfy conditions such as ease of matching between the registered image template and the observed SEM image. There are three reasons for that. A first reason is that since the AP is a pattern present at a distance through which the imaging position can be moved from EP by beam shifting, and since contamination at EP is to be suppressed, a field of view (FOV) for EP imaging may not need to be included in FOV of AP imaging. A second reason is that since the pattern needs to allow for the positioning accuracy of the stage, it is necessary for the AP to be correspondingly lower than EP in terms of imaging magnification. A third reason is that the pattern for the AP needs to be characteristic in terms of shape or brightness (the pattern for the AP is of a shape convenient for matching or has brightness).

As described later herein, according to the present invention, a CAD image that incorporates features of a more practicable SEM image can be generated as an image template while considering the above-described conditions during selection of a point as AP in the imaging recipe creation device 125. Moreover, automatic selection of an appropriate imaging point for purposes such as evaluating the image in terms of specificity, complexity, and the like, also becomes possible. In addition, during manual selection of the imaging point, a CAD that incorporates features of an actual SEM image can be displayed in, for example, a GUI screen mode of the display unit 126 in order to provide an operator with more judgment criteria.

In order to avoid image acquisition intended only to register a CAD image or a SEM image or, as disclosed in Japanese Patent Laid-Open No. 2002-328015, an image template, one possible variation of an AP image template registration method is by first registering an image template as a CAD template in the storage device 123, for example, and then re-registering the SEM image actually acquired at AP, as the image template. As described later herein, according to the present invention, since the CAD image that incorporates features of a more practicable SEM image can be generated as an image template, it becomes possible to match the CAD image to an observed SEM image more appropriately than by registering the CAD image as a template.

Next, in step S34, beam shifting based on the control and processing of the processing/control unit 115 is conducted to move the imaging position to a focusing point (FP), at which an image is then acquired and automatic focusing parameters are calculated. Automatic focusing based on the calculated automatic focusing parameters is thus conducted. A supplementary description of FP is given here. During imaging at EP, automatic focusing is conducted to acquire a clearer image. Extended irradiation of the sample 101 with electron beams, however, causes contamination to stick to the sample. For minimum sticking of contamination at EP, therefore, before observing EP on the basis of automatic focusing parameters, the processing/control unit 115 observes a coordinate point present near EP, as FP, and calculates the automatic focusing parameters. For these reasons, the FP registered in the storage device 123 should desirably satisfy several conditions. A first condition to be satisfied is that the FP is a pattern present at a distance through which the imaging position can be moved from the AP and EP by beam shifting and the field of views (FOV) for the AP and EP imaging must not be included in the FOV of FP imaging. A second condition to be satisfied is that the imaging magnification at the FP must be of much the same level as that of EP. A third condition to be satisfied is that the FP needs to have a pattern shape convenient for execution of automatic focusing (image blurring due to an out-of-focus event must be easy to detect). During the selection of FP, it is effective for the processing/control unit 115 to use the CAD image created by the imaging recipe creation device 125, as in the selection of AP. During FP selection, therefore, it is possible to provide operator support by conducting automatic FP selection that uses the above CAD image, or by making a GUI-based display of the above CAD image on the display unit 116.

Next, in step S35, beam shifting based on the control and processing of the processing/control unit 115 is conducted to move the imaging position to a stigmatic point (a stigmatism control point) (SP), at which an image is then acquired and stigmatism correction parameters are calculated. Automatic stigmatism correction based on the calculated parameters is thus conducted.

A supplementary description of SP is given here. During imaging at EP, stigmatism correction is conducted to acquire a distortionless image. Similarly to AP and FP, however, extended irradiation of the sample 101 with electron beams causes contamination to stick to the sample. For minimum sticking of contamination at EP, therefore, before observing EP on the basis of stigmatism correction parameters, the processing/control unit 115 observes a coordinate point present near EP, as SP, and calculates the stigmatism correction parameters. For these reasons, the SP registered in the storage device 123 should desirably satisfy several conditions. A first condition to be satisfied is that since the SP is a pattern present at a distance through which the imaging position can be moved from AP and EP by beam shifting, the field of view (FOV) for AP and EP imaging must not be included in FOV of SP imaging. A second condition to be satisfied is that the imaging magnification at the SP must be of much the same level as that of EP. A third condition to be satisfied is that the SP needs to have a pattern shape convenient for execution of stigmatism correction (image blurring due to stigmatism must be easy to detect). During the selection of the SP, it is effective for the processing/control unit 115 to use the CAD image created by the imaging recipe creation device 125, as in the selection of AP. During SP selection, therefore, it is possible to provide operator support by conducting automatic SP selection that uses the above CAD image, or by making a GUI-based display of the above CAD image on the display unit 116.

Next, in step S36, beam shifting based on the control and processing of the processing/control unit 115 is conducted to move the imaging position to a brightness and contrast control point (BP), at which an image is then acquired and brightness and contrast correction parameters are calculated. Automatic brightness and contrast correction based on the calculated parameters is thus conducted.

A supplementary description of BP is given here. During imaging, in order to acquire a clearer image having an appropriate brightness value and contrast, a voltage value and other parameters of a photomultiplier in the secondary electron detector 109, for example, are adjusted so that, for example, the highest level portion of an image signal and the lowest level portion are set to obtain full contrast or a contrast level close thereto. Similarly to AP and FP, however, extended irradiation of the sample with electron beams causes contamination to stick to the sample. For minimum sticking of contamination at EP, therefore, before observing EP on the basis of brightness and contrast correction parameters, the processing/control unit 115 observes a coordinate point present near EP, as BP, and calculates the brightness and contrast correction parameters. For these reasons, the BP registered in the processing/control unit 115 should desirably satisfy several conditions. A first condition to be satisfied is that since the BP is a pattern present at a distance through which the imaging position can be moved from AP and EP by beam shifting, the FOV for AP and EP imaging must not be included in the FOV of SP imaging. A second condition to be satisfied is that the imaging magnification at the BP must be of much the same level as that of EP. A third condition to be satisfied is that to obtain appropriate brightness and contrast of the image that will be acquired at an end measuring point (an evaluation point) using the parameters adjusted at the BP, the BP needs to have a pattern shape similar to that of the end measuring point (the evaluation point). During the selection of the BP, it is effective for the processing/control unit 115 to use the CAD image created by the imaging recipe creation device 125, as in the selection of AP. During BP selection, therefore, it is possible to provide operator support by conducting automatic BP selection that uses the above CAD image, or by making a GUI-based display of the above CAD image on the display unit 116.

There is a variation in which, for example, as the case may be, part or all of the automatic focusing, automatic stigmatism correction (control), and automatic brightness and contrast correction (control) processes described above in steps S34, S35, and S36, respectively, are omitted or execution order of these steps is arbitrarily changed or the coordinates of FP, SP, and/or BP overlap (e.g., automatic focusing and automatic stigmatism correction are conducted in the same place).

Finally, in step S37, beam shifting based on the control and processing of the processing/control unit 115 is conducted to move the imaging position to an evaluation point (EP), at which an image is then acquired and pattern dimensions are measured using assigned evaluation conditions to evaluate the shape of the semiconductor pattern.

An example of template positioning of imaging points AP 401, FP 402, SP 403, BP 405, and EP 404 on lower-magnification CAD data 400 than for EP is shown with dotted-line frames in FIG. 4.

An image template at AP being registered in the storage device 123 is one possible variation of a CAD image or a SEM image or a method of for example first registering the image template as a CAD template and then re-registering the SEM image actually acquired at AP, as the image template, in order to avoid image acquisition intended only to register an image template as disclosed in Japanese Patent Laid-Open No. 2002-328015.

2: Image Generation

Figure 5A:
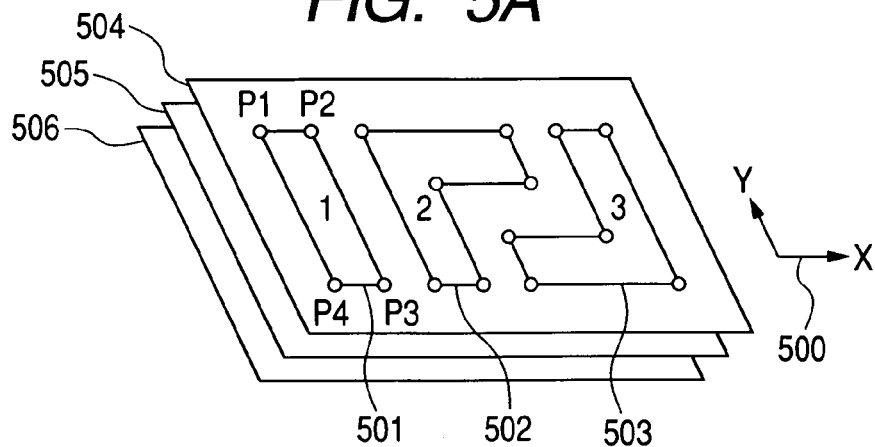
FIG. 5A is a diagram that shows layout data of design patterns according to the present invention.

The following describes an embodiment of a method of using the imaging recipe creation device 125 to convert CAD data 601 into image form and view or process the image data in order to conduct the foregoing CAD data-based imaging-point determining operations or image template registering operations on the storage device 123. Information of the CAD data 601 written in a CAD data file 507 is first described. Design information on the semiconductor patterns shown in FIG. 5A is assumed as an example in the description. In the figure, three layers, 504 to 506, are schematically shown and three patterns, 501 to 503, are shown on top layer 504. The pattern 501 includes four apexes, P1 to P4. CAD data generally contains segment information that denotes a contour or profile of a pattern shape, represented by x- and y-coordinates of the apexes P1-P4, and layer information of the layers 504-506. The x- and y-coordinates are expressed in an arbitrary reference coordinate system 500, each having a unit of nanometers or the like.

The three process steps required for, or becoming effective during processing subsequent to, the conversion of the CAD data 601 into a CAD image 605 by the CPU (CAD image creation unit) 1251 of the imaging recipe creation device 125, will be next described. The three process steps are, as shown in FIG. 6, an image-quantizing width determination step S61, a brightness information providing step S62 based on various attributes, and a pattern shape deformation step S63. Reference number 606 denotes a CAD image created with an arbitrary image-quantizing width in step S61, 607 denotes a CAD image provided with brightness information in step S62 on the basis of arbitrary attribute information, and 608 denotes a CAD image to which a change in SEM signal quantity, associated with pattern shape (profile) deformation or an edge effect or the like, is provided as a change in brightness value in step S63.

2.1: Image-Quantizing Width Determination Step

An example of executing image-quantizing width determination step S61 using the image-quantizing width determination section 12511 will be described using FIGS. 7 to 14. The ROI (Region Of Interest) data determined by, the minimum line width/minimum inter-pattern distance data calculated by, reference width "Dp" data within the calculated ROI, the image-quantizing width "r" (=Di/Dp) data and other data determined by the image-quantizing width determination section 12511 using the CAD data 601 are stored into the storage device 127, for example. The CAD image 606 (605) that has been formed by converting the CAD data including the template position coordinates of observation points (AP, FP, SP, BP, EP) is stored into the CAD image memory 1253.

2.1.1: Example of Reference Pattern Width "Dp" (Minimum Line Width, Minimum Inter-Pattern Distance)

First, in step S611, a region is extracted from the written CAD data within the CAD data file 507 and determined as an imaging region in order to convert the CAD data 601 into image form. Hereinafter, this region is called a ROI (Region Of Interest). Next, the number of pixels equivalent to the image-quantizing width (the unit pattern dimension, say, 1 nm, written in the CAD data file 507) on the image is determined. Determination of the image-quantizing width itself, however, is an important factor. That is to say, inadvertent reduction of the image-quantizing width will result in an image size redundant for complexity of the shape of the pattern drawn. Thus, more image memory space than necessary will be used and a greater deal of calculation time will be spent in various image processing. Conversely, increasing the image-quantizing width too much will result in the patterns being concatenated or disappearing during quantization or in some other inconvenience of the on-image pattern shape significantly differing from the pattern shape actually required.

In the present invention, therefore, during the conversion of the extracted CAD data into image data, since a pattern structure needs to have been saved during subsequent CAD image processing, the image-quantizing width is determined with the pattern width to be noted, as a reference (hereinafter, this reference is called the reference pattern width). A minimum dimension (minimum line width of the pattern or the minimum inter-pattern distance) is used as an example of the reference pattern width.

The minimum line width is a minimum dimension of the pattern width used in semiconductor circuit design, and this dimension is typically given as gate length (or the like) of a transistor. In the present invention, the minimum line width also contains the minimum pattern width of all patterns or any pattern within the ROI. When the semiconductor pattern shapes 701, 703, 705 shown in FIGS. 8A to 8C by way of example are viewed alone, the minimum line width is given as distances 702, 704, 706, respectively. Also, as shown in FIGS. 8D, 8E, when a pattern shape (e.g., 709) of the CAD data provided with optical proximity correction (OPC) performed to prevent deformation of a resist pattern due to a diffraction phenomenon of light during exposure is taken as an input with respect to a pattern shape to be created on the wafer (e.g., for the pattern 707, the minimum line width is given as the distance 708), it is possible to select a dimension of the narrowest section 711 of the pattern existing before OPC is conducted, as the minimum line width, or to select a dimension of the narrowest section 710 of the pattern existing after OPC has been conducted, as the minimum line width.

The minimum inter-pattern distance is the minimum inter-pattern dimension used in semiconductor circuit design. When the semiconductor pattern shapes 712-713 or 715-716 shown in FIGS. 9A, 9B by way of example are viewed alone, the minimum line width is given as distances 714, 717, respectively. However, in perspective of the measure of the potential hazard that thickness of the patterns may cause short-circuiting therebetween, when the distance 717 is broken down in x- and y-directions and a distance 718 in the x-direction and a distance 719 in the y-direction are taken as Dy and Dx, respectively, the minimum inter-pattern distance between the pattern shapes 715-716 is given as the greater of the two distances, that is, in FIG. 9B, as Dy (Dy>Dx). As the case may be, the minimum inter-pattern distance includes such a distance 721 between sections in one pattern as given by the pattern shape 720 of FIG. 9C.

If the ROI contains a plurality of patterns and the above minimum line width or minimum inter-pattern distance differs between the plurality of patterns, respective minimum values can be defined as a minimum line width or minimum inter-pattern distance within the ROI.

An increase or decrease in the pattern thickness with respect to a dimensional design value could cause a device defect such as a short circuit or an open state. The minimum line width or minimum inter-pattern distance within the ROI has connection with circuit design margins against the above device defect such as a short circuit or an open state. It is therefore effective to determine the image-quantizing width on the basis of the minimum line width or minimum inter-pattern distance within the ROI, and to determine a to-be-monitored EP for an original design pattern on the basis of image data concerning a design pattern free of pattern disappearance, concatenation, and the like. The image data concerning a design pattern free of pattern disappearance, concatenation, and the like, is also effective for determining AP, FP, BP, SP.

Figure 13A:
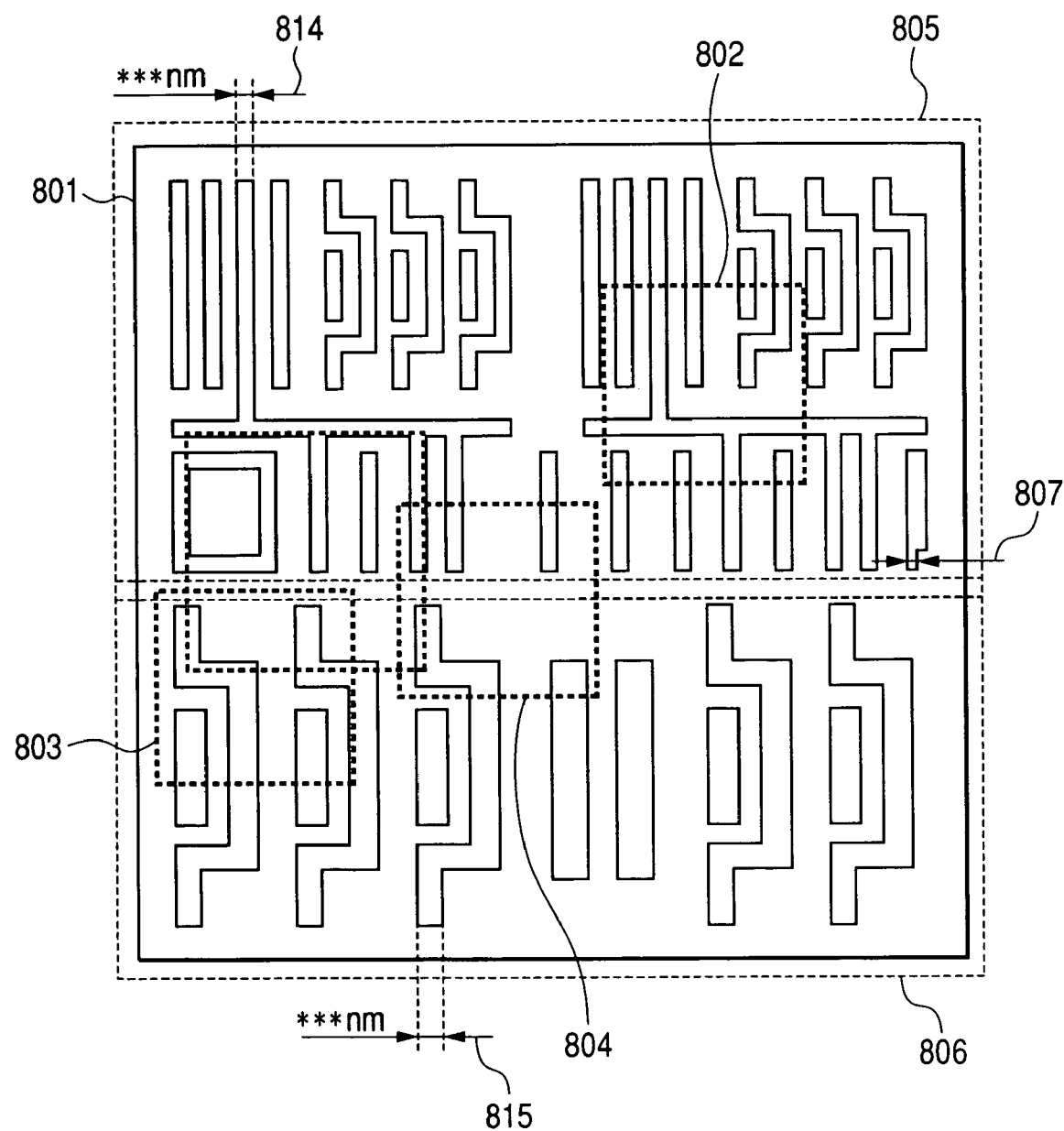
FIG. 13A is a diagram showing a CAD image created from CAD data.

A more specific example of converting a ROI 802 from CAD data 801 of FIG. 13A into image data will be considered next. FIG. 7A shows a process flow of the image-quantizing width determination step S61. First, a region to be extracted from the CAD data in order to conduct the conversion into image data is determined as a ROI in step S611. Next, during definition of the reference pattern width as the minimum line width within the ROI (there can be a variation of using the minimum line width or the minimum inter-pattern distance as the reference pattern width, or using the minimum line width or the minimum inter-pattern distance, whichever is the smaller, as the reference pattern width), the minimum line width is calculated for each pattern within the ROI in step S612. In step S613, reference pattern width "Dp" (expressed in nanometers, for example) within the ROI is calculated as, for example, the minimum line width of each pattern mentioned above. That is to say, as shown in FIG. 13B, minimum line width 808 (=Dp) within the ROI is calculated from the ROI 802.

Next, image-quantizing width "r" (pixels/nm) is determined on the basis of reference pattern width "Dp" in step S614. Image-quantizing width "r" is given as "r=Di/Dp" using the dimension "Di" (pixels) on the image of the reference pattern width "Dp". As shown in FIG. 13B, the reference pattern width "Dp" 808 (nm) on the CAD image 809 created from the CAD data 802 becomes "Di" 810 (pixels). The dimension "Di" on the image is assigned the value that does not cause inconvenience during the arbitrary analysis (data viewing, image processing) conducted after image conversion, and the "Di" value can be changed according to particular details/kind of analysis, or for each manufacturing process for the semiconductor, or for each position on the wafer, or for each set of SEM imaging conditions (including an imaging magnification, image quality data, and others).

Conversely, for similar analysis, as shown in FIGS. 13B, 13C as an example, the image-quantizing width differs according to the ROI actually set up, and even if the above-mentioned ROI is of the same region size (actual size), the CAD image that has been obtained by the conversion can differ in region size (image size). That is to say, the reference pattern width "Dp" within ROI 803, denoted as 811 in FIG. 13C, is greater than the reference pattern width "Dp" within ROI 802, denoted as 808 in FIG. 13B, in other words, the pattern line width included in ROI 803 is greater than the pattern line width included in ROI 802. Accordingly, if such image quantizing is conducted that causes the respective reference pattern widths "Dp" 808, 811 of ROIs 802, 803 to become the same value on the image, the CAD images 809, 812 created from the ROIs differ in image size. The reference pattern widths "Di" 810, 813 on the CAD images 809, 812, however, are equal and when the line widths is noted, similar analytical results will be obtained between both images.

2.1.2: Problem-Causing Variation in Reference Pattern Width Determination (Image Edges, Pattern Splitting, and an Example of Minority in Votes)

Next, a supplementary description will be given of a variation of an image-quantizing width determining method.

Figure 10:
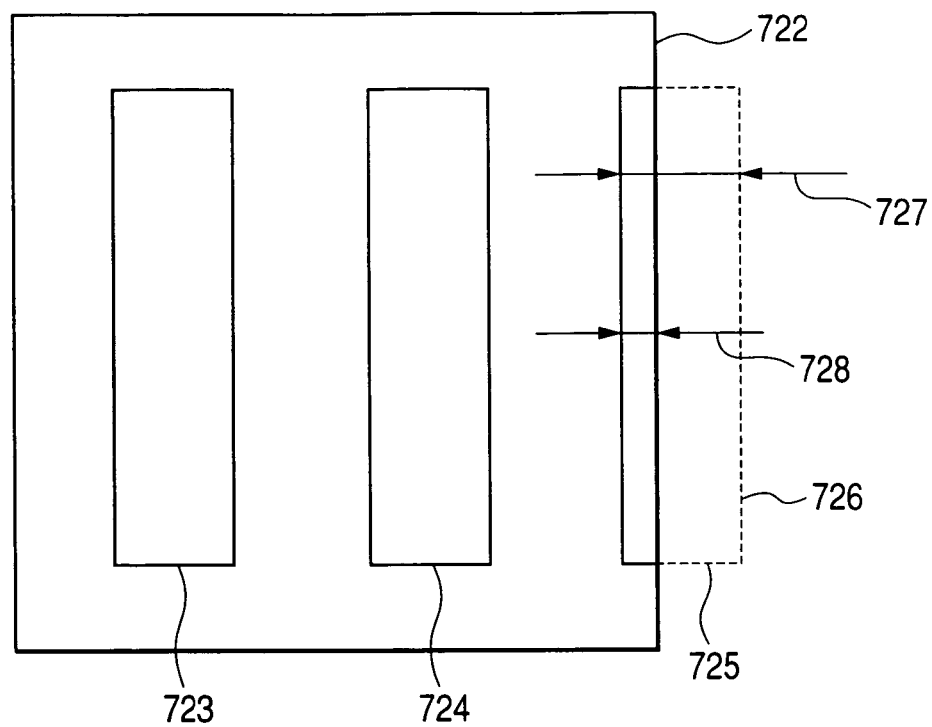
FIG. 10 is a diagram showing a case in which an original minimum line width cannot be determined because of one pattern being split by a boundary of an extraction region.
Figure 11A:
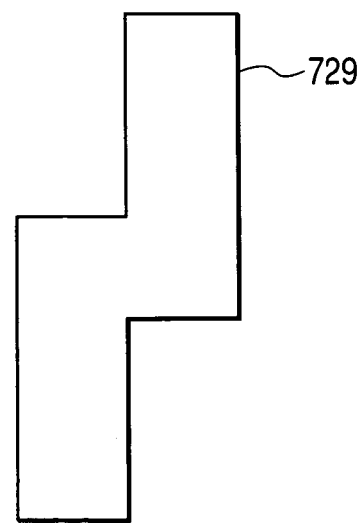
FIG. 11A is a diagram showing a resist pattern formed on a wafer.
Figure 11B:
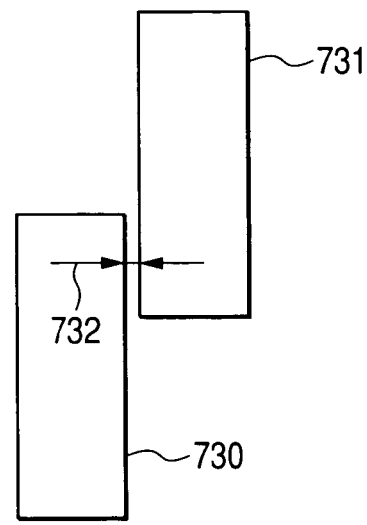
FIG. 11B is a diagram showing two exposure masks for forming the resist pattern of FIG. 11A.

First, the following problem occurs when minimum line width within a ROI is to be calculated in relation with a method of determining reference pattern width "Dp". That is to say, for example, when as shown in FIG. 10, respective minimum line widths of patterns 723, 724, 725 within a ROI are calculated and the smallest of the calculated values is defined as the minimum line width within the ROI, as with the pattern 725, one pattern originally formed by combining the pattern 725 of a solid line and the pattern 726 of a dotted line is split by a boundary of an extraction region 722. In that case, an after-extraction minimum line width 728, not an original minimum line width 727, will be obtained, even if the pattern 725 of a solid line is processed.

Calculation of the line width that originally does not exist could occur, depending on a particular manner of setting up such an extraction region. The calculation can be avoided using any one of five methods. A first method is by setting up an extraction region ROI so that the ROI does not span over one pattern. A second method is by extruding the minimum line width that has been calculated from the pattern positioned at an end/edge of an extraction region, from the use intended for processing during calculation of desired pattern width. A third method is by calculating minimum line width from before-extraction pattern shape information. A fourth method is by acquiring as preliminary input information the line width that can exist as minimum line width, and if line width values smaller than the preliminary input information are calculated, not using those values. A fifth method is by creating a histogram from the minimum line width that has been calculated from each pattern within a ROI, and calculating the reference pattern width existing in the ROI, from the distribution obtained.

A supplementary description is given below of the above third method of calculating the minimum line width from the before-extraction pattern shape information. To know the line width existing before extraction, it is effective, after determining the extraction region ROI, to identify the pattern positioned at the boundary of the region, and examine the contour shape existing before the extraction. Alternatively, it is effective to calculate line widths of each pattern before the extraction, and manage these line widths as a set of pattern attributes. For example, it is effective to calculate minimum width information for each pattern, as denoted by 510 in FIG. 5B, and write the information into a data file or the like. Since the minimum width information is shared before and after the extraction, actual minimum width information is not lost by the extraction. When the minimum inter-pattern distance and other pattern-dependent attributes described later are calculated before or after ROI extraction, managing the above distance and attributes by use of the file 507 or displaying the distance and attributes in the GUI screen mode of the display unit 126 is likewise effective in arbitrary analysis.

FIG. 7B shows a process flow of converting CAD data into image data by, before starting the ROI extraction, calculating reference pattern width from obtained attributes such as the minimum line width. First, in order to determine reference pattern width in the step S613, the minimum line width and other information to be used as reference is calculated for each pattern in step S612. Next, the ROI is determined in step S611. Subsequent steps are the same as those described in FIG. 7A.

Also, the following problem occurs when the minimum distance between patterns within the ROI is to be calculated in relation with a method of determining reference pattern width "Dp". That is to say, the two exposure masks 730, 731 shown in FIG. 7 11B may be used to create on the wafer the resist pattern 729 shown in FIG. 11A, for example. If a distance 732 between the exposure masks 730, 731 is very short, the patterns created will also be concatenated by concatenating between these exposure masks 730, 731 on the luminous intensity distribution obtained during exposure, so the exposure masks themselves will not be affected. However, for example, if calculating the minimum inter-pattern distance from the exposure masks 730, 731 is attempted, the distance 732 that originally does not exist could be calculated as the minimum inter-pattern distance. This can be avoided using either of two methods. A first method is by acquiring as preliminary input information the distance that can exist as the minimum inter-pattern distance (>the distance between the patterns concatenated during exposure), and if line width values smaller than the preliminary input information are calculated, not using those values. A second method is by creating a histogram from the minimum inter-pattern distance that has been calculated from each pattern within a ROI, and calculating the reference pattern width existing in the ROI, from the distribution obtained.

Figure 12:
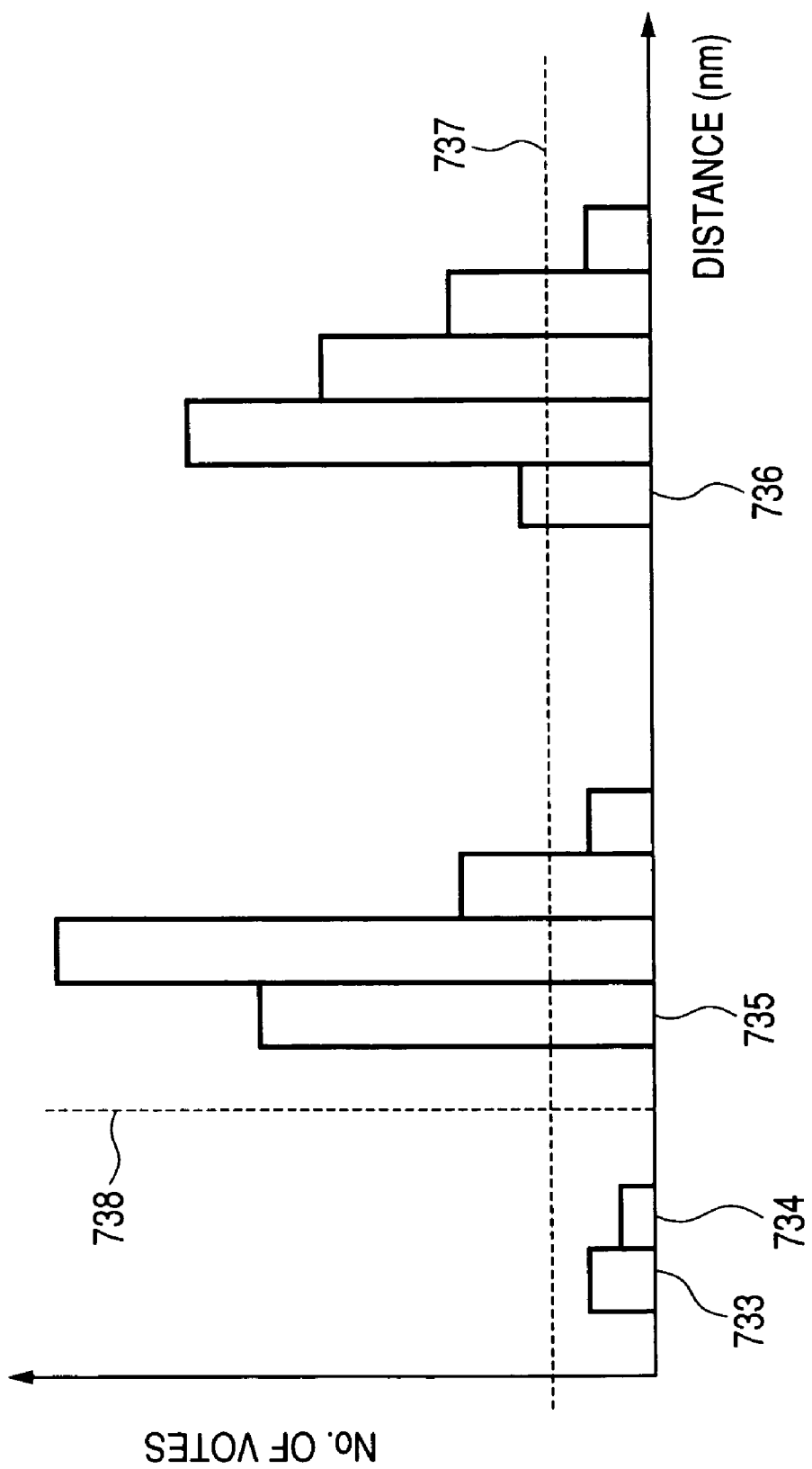
FIG. 12 is a diagram explaining an example of determining minimum line width by the number of votes.

The above method "by creating a histogram from the minimum line width or minimum inter-pattern distance that has been calculated from each pattern within a ROI, and calculating the reference pattern width existing in the ROI, from the distribution obtained" will be described in further detail using FIG. 12. A method of calculating the reference pattern width from the minimum line width within the ROI is described below as an example. First, the minimum line width is calculated for each pattern within the ROI and then as shown in FIG. 12, votes are conducted on the histogram, wherein a horizontal axis denotes a distance (in this example, the minimum line width) and a vertical axis denotes the number of votes). The shortest distance that has been voted for in this example is a distance 733, but the number of votes for patterns associated with the distance 733 is very small. It is therefore possible to incorporate processing in which the distances whose number of votes is less than a threshold value 737 of the number of votes arbitrarily given (in FIG. 12, distances 733, 734) will be excluded from calculation of the minimum line width within the ROI. It is also possible to incorporate processing in which the line width (e.g., 738) that can exist as minimum line width will be acquired as preliminary input information, and if the line width values (in FIG. 12, line widths 733, 7344) that are smaller than the preliminary input information are calculated, those values will not be used as the minimum line widths. Such processing will make it possible to prevent minor line widths and other line widths not important in device characteristics, as with the line width 807 shown in FIG. 13, from being selected as typical minimum line widths within the ROI.

2.1.3: More Specific Methods of Calculating the Minimum Line Width and the Minimum Inter-Pattern Distance Direct calculation from CAD data (numeric data of the apex coordinates of the pattern) and calculation from the CAD image obtained by converting CAD data with a suitable image-quantizing width value are available as more specific methods of calculating the minimum line width and the minimum inter-pattern distance in each pattern or the ROI. In the latter of the above two methods, the minimum line width or minimum inter-pattern distance obtained will have a quantizing error of inaccuracy equivalent to the suitable image-quantizing width value.

Figure 14B:
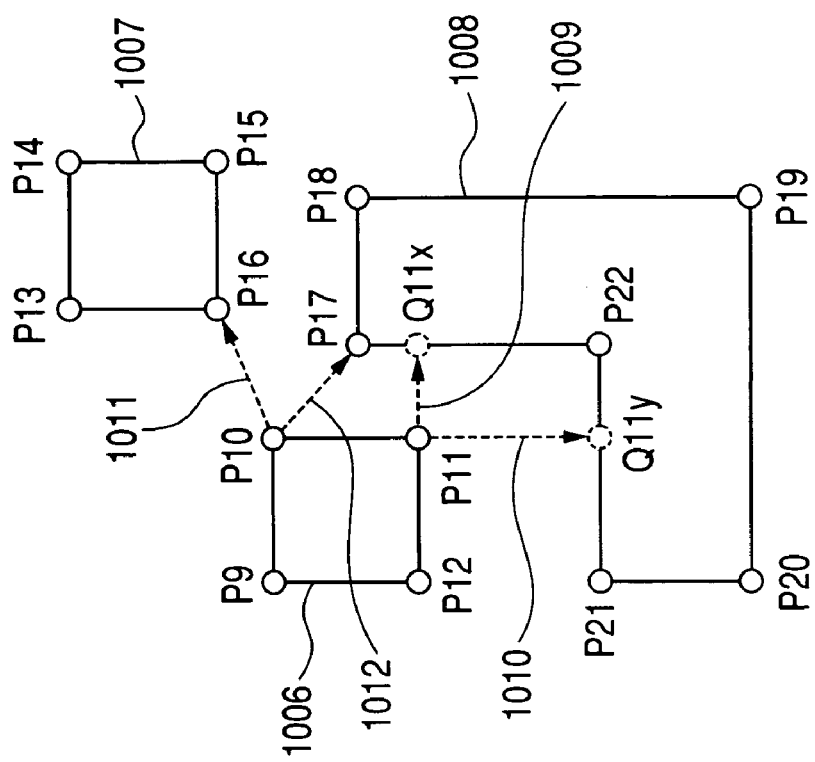
FIG. 14B is a diagram showing an example of a calculation method for a minimum inter-pattern distance.
Figure 14A:
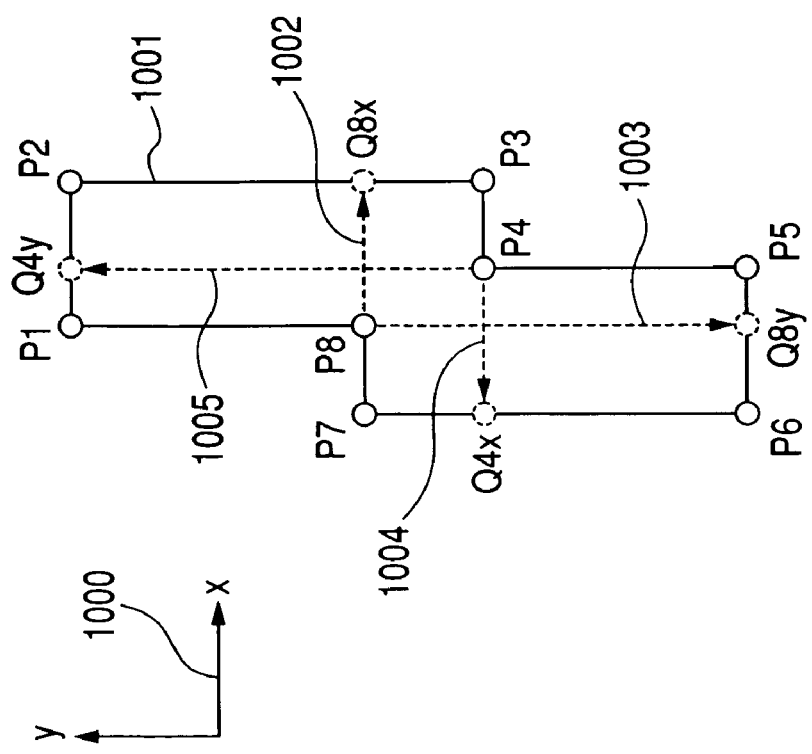
FIG. 14A is a diagram showing an example of a calculation method for minimum line width.

An example of a calculation method for a minimum line width of a pattern 1001 is shown in FIG. 14A. The pattern 1001 has eight apexes, P1 to P8. For example, a straight line is drawn from the apex P8, in an x-direction of an x/y coordinate system 1000 and in an internal direction of the pattern, and a position at which the line first intersects with the pattern is determined as a crossing point Q8x. During direct calculation from CAD data, whether crossing points exist between the line 1002 drawn from the apex P8, and each segment constituting a contour of the pattern 1001 (a segment between apexes P1, P2, a segment between apexes P2, P3, and so on up to a segment between apexes P8, P1) is sequentially examined by calculation, as an example of determining the crossing point Q8x.

During calculation from the CAD image obtained by converting CAD data with a suitable image-quantizing width value, the pattern is scanned along a straight line 1002, from the apex P8, in the internal direction of the pattern, and a coordinate point at which a boundary of the pattern first appears is taken as a crossing point. Similarly, a straight line is drawn from the apex P8, in a y-direction and in the internal direction of the pattern, and a position at which the line first intersects with the pattern is determined as a crossing point Q8y. Distances 1002, 1003 from the apex P8 to ends of the pattern in the x- and y-directions are thus calculated. The same is also conducted for each of the other apexes (distances from the apex P4 to the ends of the pattern in the x- and y-directions are given as 1004, 1005 in another example). The shortest of the thus-obtained distances 1002 to 1005 is taken as the minimum line width of the pattern 1001.

An example of a calculation method for a minimum inter-pattern distance of a pattern 1006 is shown in FIG. 14B. In this figure, three patterns, 1006 to 1008, are shown and these patterns have apexes P9-P12, P13-P16, and P17-P22, respectively. First, a straight line is drawn, for example, from the apex P10 to an apex of another pattern (say, P16, P17), and a distance between the apexes is calculated (e.g., distance 1011, 1012). The example here assumes that the above line does not pass through an arbitrary pattern inclusive of the own pattern 1006 and another pattern (1007, 1008). If, as with the distance 721 shown in FIG. 9C, the distance 721 between sections on one pattern is to be included in the minimum inter-pattern distance, the above distance includes both a distance of the segment drawn from the apex P10 to an apex of another pattern, and a distance of the segment drawn from the apex P10 to another apex of the pattern 1006. The example here assumes that the line, even if drawn between apexes of the same pattern, does not pass through there. In actuality, however, such a line does not exist in the example shown. A similar inter-apex distance calculation is also conducted for other apexes of the pattern 1006.

Figure 9C:
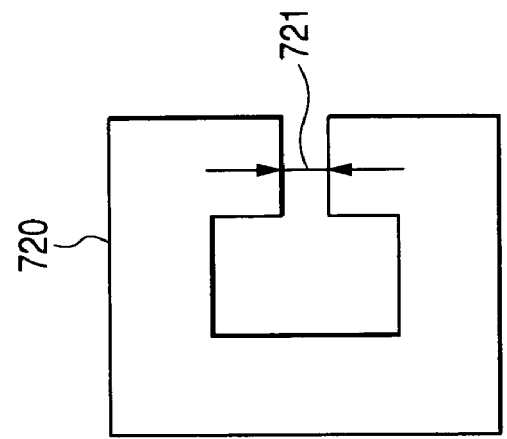
FIG. 9C is a diagram showing a semiconductor pattern shape in which a minimum inter-pattern distance is given by 721.
Figure 9B:
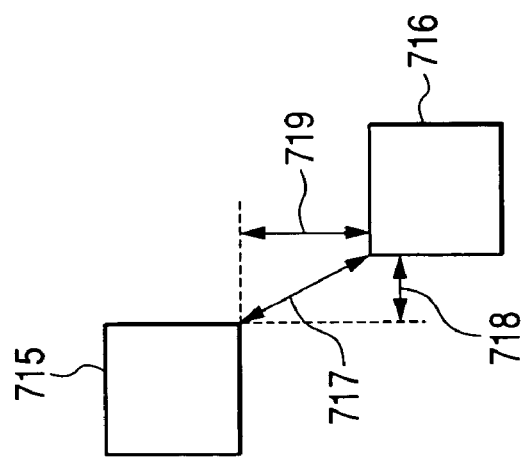
FIG. 9B is a diagram showing a semiconductor pattern shape in which a minimum inter-pattern distance is given as 717.
Figure 9A:
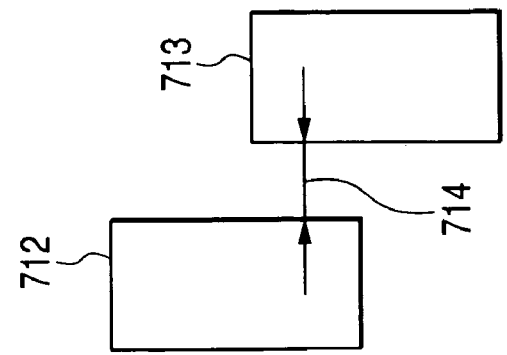
FIG. 9A is a diagram showing a semiconductor pattern shape in which a minimum inter-pattern distance is given as 714.

Next, a straight line is drawn, for example, from the apex P11, in the x-direction of the x/y coordinate system 1000 and in an external direction of the pattern, and a position at which the line first intersects with the pattern is determined as a crossing point Q11x. Similarly, a straight line is drawn from the apex P11, in the y-direction and in the external direction of the pattern, and a position at which the line first intersects with the pattern is determined as a crossing point Q11y. Distances 1009, 1010 from the apex P11 to ends of the pattern in the x- and y-directions are thus calculated. The same is also conducted for each of the other apexes of the pattern 1006. Finally, the shortest of the above-mentioned inter-apex distance (e.g., distance 1011, 1012) and distances 1009, 1010 in the x- and y-directions is taken as the minimum inter-pattern distance. In this example, the distance 1009 is taken as the minimum inter-pattern distance. The minimum inter-pattern distance between the pattern shapes 715-716 in FIG. 9B is determined by calculating the distance 718 in the x-direction and distance 719 in the y-direction, both obtained when the distance 717 is broken down in the x- and y-directions, and taking the distances 718 and 719 as Dx and Dy, respectively. The minimum inter-pattern distance between the pattern shapes 715-716 is there given as Dy (Dy>Dx). Similarly, the larger of the components obtained by breaking down an appropriate distance in the x- and y-directions can be used as the inter-apex distance mentioned above.

2.1.4: Variations of a Reference Pattern Width Determining Method

A method in which the smallest value of the minimum line widths or minimum inter-pattern distances of each pattern is used as reference pattern width has been described in the foregoing example. Several other variations are also usable as methods of determining reference pattern width. That is, the reference pattern width selected depends on how the CAD image that has been generated from reference pattern width is used.

For example, consider a case in which an AP position is determined from the CAD image that has been created using the CAD data 801 of FIG. 13A as an example. For the CAD data 801, patterns whose line widths can be broadly divided into two kinds exist in mixed form. The patterns with the smaller line width (typical line width 814) are distributed in a region 805, and the patterns with the greater line width (typical line width 815) are distributed in a region 806. Since AP is an addressing point, this imaging region has a characteristic pattern, so for proper detection of a deviation between an actual observing position of AP and an initially set AP position, changes in correlation value between an actual observation image and a registered AP template image desirably have high sensitivity against the deviation. Also, AP is imaged at a magnification lower than that of EP. If the smaller line width 814 distributed in the region 805 is observed in a collapsed or color-coded state or does not form a characteristic pattern shape in the low-magnification SEM image that has been observed for AP use, the pattern shapes of the smaller line width 814 do not always need to have been saved in a CAD image. In that case, image-quantizing width may be determined with the greater line width (typical line width 815) taken as reference pattern width. As a result, a CAD image 818 can be obtained by converting CAD data into image data such that as shown in, for example, FIG. 13D, the reference pattern width (nm) 815 becomes to an image size (pixels) 819.

Also, consider a case in which an EP position is determined. Since EP is an imaging position intended for high-magnification monitoring of such an end measuring point (a dimension-measuring point) that leads to a device defect, there is a need to conduct the above determination allowing for small line width values such as the line width 814, so image-quantizing width may be determined with the line width 814 taken as reference pattern width. As a result, a CAD image 816 can be obtained by converting CAD data into image data such that as shown in, for example, FIG. 13D, the reference pattern width (nm) 814 becomes to an image size (pixels) 817.

In the above-mentioned determination of AP or EP, the reference pattern width and the reference pattern width existing after the image conversion has been made can be arbitrarily given to calculate image-quantizing width suitable for various image processing, or to calculate the image-quantizing width used to appropriately express the line width that wants to be noted during data viewing. The reference pattern width and the reference pattern width existing after the image conversion can be either managed as defaults for each process by the system used for imaging, or arbitrarily given by a user. In addition, the image-quantizing width at which the magnifications of the SEM image and the CAD image agree can be given for matching between both images.

2.2: Brightness Information Provision Based on Various Attributes

Next, examples of using the brightness information providing section 12512 to execute brightness information providing step S62 based on various attributes will be described using FIGS. 16 to 18, 19A, and 19B. A CAD image 607 (605) to which brightness information based on various attribute information has been assigned to each pixel is stored into the CAD image memory 1253 or temporarily stored into the storage device 127. That is, a description will be given of a method in which, when CAD data 601 is converted into the CAD image, brightness information convenient for any analysis (data viewing, image processing) with the CAD image is assigned to each pixel of the CAD image 607 on the basis of attribute information. The above attribute information includes part or all of mask pattern partial removal information (i.e., whether a particular location at a resist mask is a resist-photosensitizing location), or the kind of material of the sample surface (semiconductor pattern) at an associated position, or lower layers, or manufacturing processes (process steps), or layers, or pattern shapes, or roughness/fineness levels of the patterns, or design margins.

Effective analysis of an effective CAD image becomes possible by incorporating various attribute information into brightness data as described above. More specifically, explicitly expressing the various attribute information enables the analysis that simultaneously allows for both the various attribute information and a distribution thereof on the wafer. The explicitly expressing the various attribute information is particularly effective in automatic searching for AP, FP, SP, BP, EP during image processing. Depending on the kind of various attribute information allowed for, CAD images having brightness patterns similar to those of an actual SEM image can also be generated, in which case, essentially the same analysis as that which uses the SEM image is possible.

2.2.1: Attribute Example 1 (Differences in Partial Unmasking Information Volume)

Using mask pattern partial removal information as attribute information will be described as an example of CAD image generation based on the foregoing attribute information. FIG. 15A shows a CAD image of a mask pattern. This figure assumes that a resist material has its polarity inverted according to a positive/negative state. The figure also assumes, for example, that the inside of pattern 1102 is a region optically sensitized to form the pattern, and that a region 1103 is a region formed as an underlayer without being optically sensitized. The image obtained by drawing the pattern 1102 and other elements with contour lines in this way is hereinafter called a contour image. As shown in FIG. 16A, however, partially unmasked regions may each be color-coded with a different brightness value according to a particular difference in partially removed mask pattern state. A monochrome binary image with patterns color-coded in black, inclusive of a pattern 1110, is shown in FIG. 16A. Any brightness values other than black and white can be combined. Hereinafter, the image having the regions color-coded in accordance with the attribute information represented by mask pattern partial removal information is called a color-coded image.

An example of the effect of incorporating the difference in partially removed mask pattern state into brightness data is described below. When image processing is used to determine what position (ROI) is to be registered as AP by use of the CAD image 1101, whether the AP is an appropriate imaging region may be judged using factors such as an index of whether a selected pattern is characteristic. For example, a ROI 1104 is selected as the AP in FIG. 15A. When those CAD images 1105, 1107 of FIGS. 15B, 15C that are of the same CAD data as that of respective original CAD images but differ in image-quantizing width are subjected to similar judging processing, the results obtained are likely to significantly differ between both images. For example, ROIs 1106, 1108 are likely to be selected as APs.

In an image 1109 with the patterns color-coded on the basis of unmasking information, when AP searches are conducted on the CAD images 1113, 1115 of FIGS. 16B, 16C that differ in image-quantizing width, similar results are obtainable and improved stability of the AP searches is anticipated. This is because color-coded images 1109, 1113, 1115 are greater than contour images 1101, 1105, 1107 in terms of a rate of the number of pixels indicating each pattern within the ROI, and thus because features of these color-coded images are expected to be more readily and more accurately identifiable in terms of pattern shape. Also, the difference in image-quantizing width causes deformation of the pattern shape due to a quantizing error, but a rate of the deformation in the ROI is lower in the color-coded images. For the contour images, however, all pixels indicating the each pattern are basically affected by a quantizing error.

2.2.2: Attribute Example 2 (Differences in the Kind of Material and in Manufacturing Process)

Another example of attribute information will be next described in perspective of differences in the kind of sample's material at an associated position or in manufacturing process. The differences in the kind of sample's material or in the kind of manufacturing process (e.g., surface roughness of the sample differs according to the kind manufacturing process of CMP (chemical mechanical polishing) process etc.) cause a change in the quantity of secondary electrons emitted from the sample surface after electron beam irradiation, and lead to changes in brightness values of SEM images. If these factors changing the brightness values of the SEM images are managed as attribute information and the attribute information is incorporated into brightness values of CAD images, it will be possible to generate a CAD image that incorporates characteristic differences in SEM signal quantity due to the above differences in attributes.

Figure 17B:
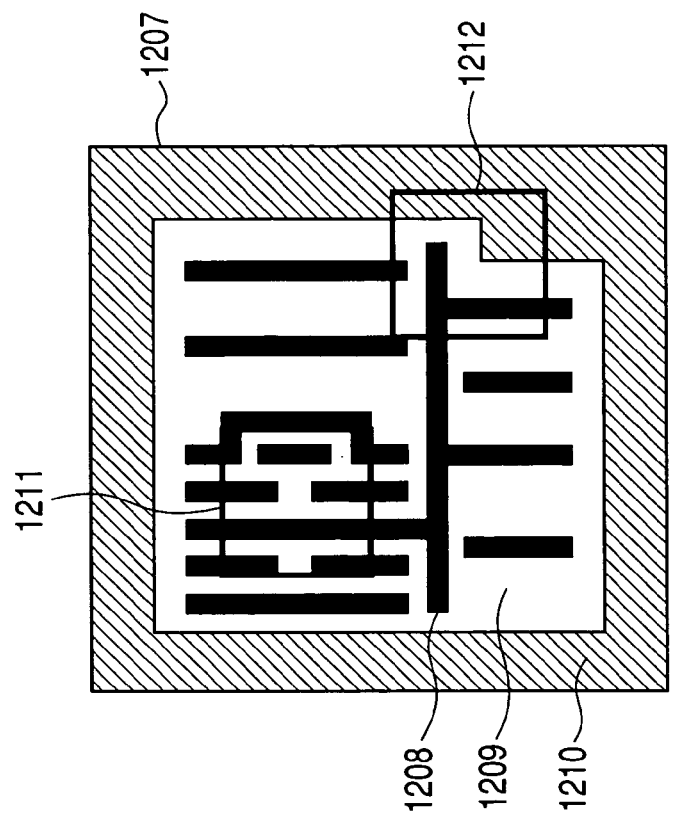
FIG. 17B is a diagram showing a CAD image that incorporates differences in brightness values of a SEM image.
Figure 17A:
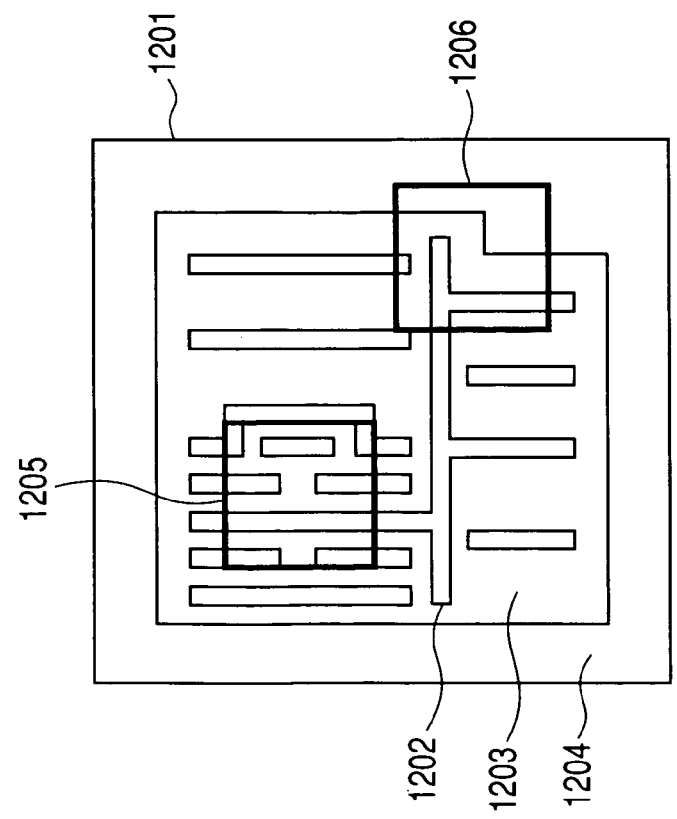
FIG. 17A is a diagram showing a CAD image that includes a plurality of patterns and two kinds of underlayers.

The CAD image 1201 shown in FIG. 17A includes a plurality of patterns (e.g., 1202) and two kinds of underlayers 1203, 1204. The underlayers 1203, 1204 have a difference in the kind of material of the sample surface or a difference in the kind of manufacturing process in which, for example, the sample surface differs in surface roughness according to the kind of manufacturing process of the CMP process etc. The underlayers 1203, 1204 have respective different brightness values in actual SEM images. Accordingly, these differences are expressed as the differences in the brightness values of CAD images. Such a state is shown in FIG. 17B, for instance. In this figure, a CAD image is generated as a multivalued image (in this example, three-level image) whose pattern section, e.g., 1208, and underlayers 1209 and 1210 each have a difference brightness value. The fact that results equivalent to more practical SEM imaging results can be obtained during any analysis is anticipated by generating such a CAD image. Although a template with a characteristic brightness pattern is to be selected as AP during AP determination based on a CAD image, the conventional CAD image 1201 of FIG. 17A is likely to be judged that since a ROI 1205 has a more complex pattern than a ROI 1206, the ROI 1205 is appropriate as AP. As a matter of fact, however, the ROI 1206 has a difference in brightness value between the underlayers 1203 and 1204 in a SEM image, and this characteristic contrast level may render the ROI 1206 appropriate as AP. Such information cannot be considered during line drawing only with a pattern contour such as that of the CAD image 1201. For the CAD image 1207 shown in FIG. 17B, however, a ROI 1212 can be selected as AP since the above contrast information is incorporated in brightness information of the CAD image.

2.2.3: Attribute Example 3 (Difference in Lower Layer)

Yet another example of attribute information will be next described in perspective of whether a lower layer is present at an associated position. As shown in FIG. 5A, a plurality of layers (e.g., 504 to 506) are stacked to form semiconductor patterns. In a SEM image, not only the pattern existing on the uppermost layer but also the patterns existing on lower layers may require observation. FIG. 18A is an overlapped representation of two layers in a CAD image 1213, in which representation, a pattern on the upper layer is drawn with a solid line (e.g., upper-layer pattern 1214) and a pattern on the lower layer is drawn with a broken line (e.g., lower-layer pattern 1215). In this case, the pattern boundary 1217, 1218 observed in the SEM image is extracted on the basis of a relationship in position between the layers in a CAD image 1216, as shown in FIG. 18B, and the patterns on the layers 1220, 1221 are color-coded for each layer, as shown in FIG. 18C. Thus, a CAD image 1219 is generated.

2.2.4: Attribute Example 4 (Differences in Pattern Line Width, in Pattern Roughness/Fineness Level, and in Design Margins)

Figure 19A:
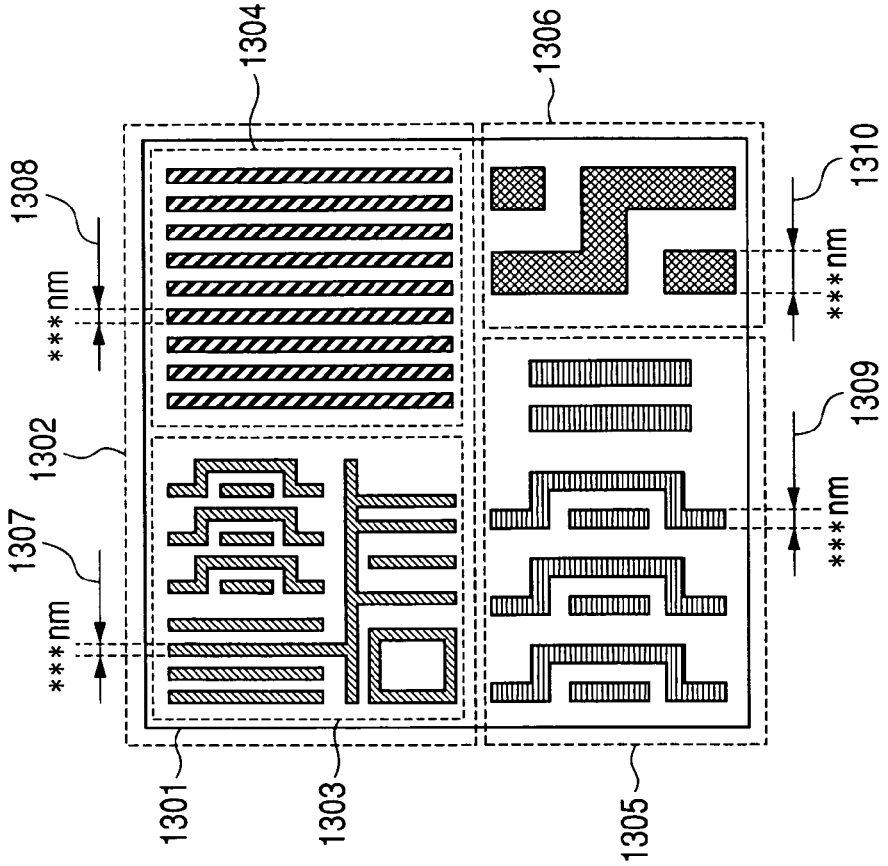
FIG. 19A (*a*) is a diagram showing a CAD image with a plurality of mixed patterns each having a different line width, FIG. 19A (*b*) is a diagram showing a CAD image with changes in color-coding brightness value between a logic block and a memory block in the plurality of mixed patterns of different line widths, FIG. 19B (*a*) is a diagram showing a CAD image with an entire region color-coded in the mixed state of the plural patterns each having a different line width, and FIG. 19B (*b*) is a diagram showing a CAD image having a region color-coded by combining the color-coding methods of FIGS. 19A (*b*) and 19B (*a*) in the mixed state of the plural patterns each having a different line width.
Figure 19A:
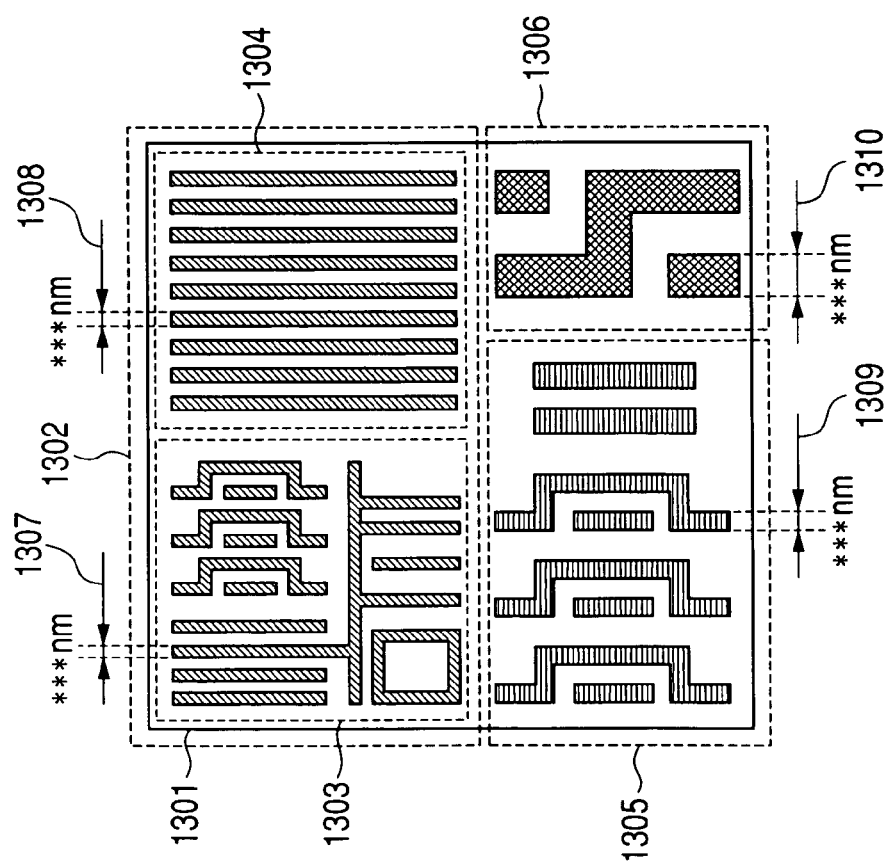

Still another example of attribute information will be next described in perspective of a difference in pattern shape or in pattern roughness/fineness level. As shown in FIG. 19A (*a*), the sample may have a plurality of mixed patterns each having a different line width (e.g., line widths 1307 to 1310). A CAD image is generated with each pattern color-coded according to the particular line width thereof. More specifically, in a region 1302, for example, the patterns with the line width 1307 or 1308 (line width similar to the line width 1307) or with a line width similar thereto are present, and in a CAD image 1301, these patterns are color-coded with one desired brightness value. Similarly, in a region 1305, for example, the patterns with the line width 1309 or with a line width similar thereto are present, and in the CAD image 1301, these patterns are color-coded with one desired brightness value (different from the color-coding brightness value in the region 1302).

Even in a region with patterns of the same line width, the color-coding brightness value can be changed between a logic block 1303 and a memory block 1304, as shown in FIG. 19A (*b*). Patterns with such changes in the color-coding brightness value are generally called repeated patterns.

Figure 19B:
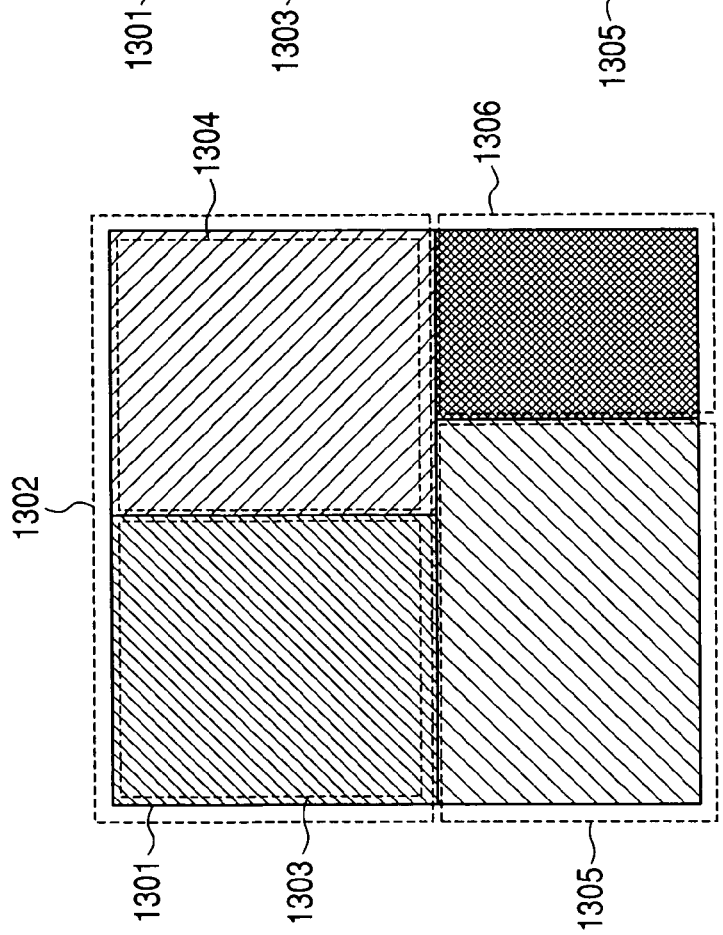
Figure 19B:
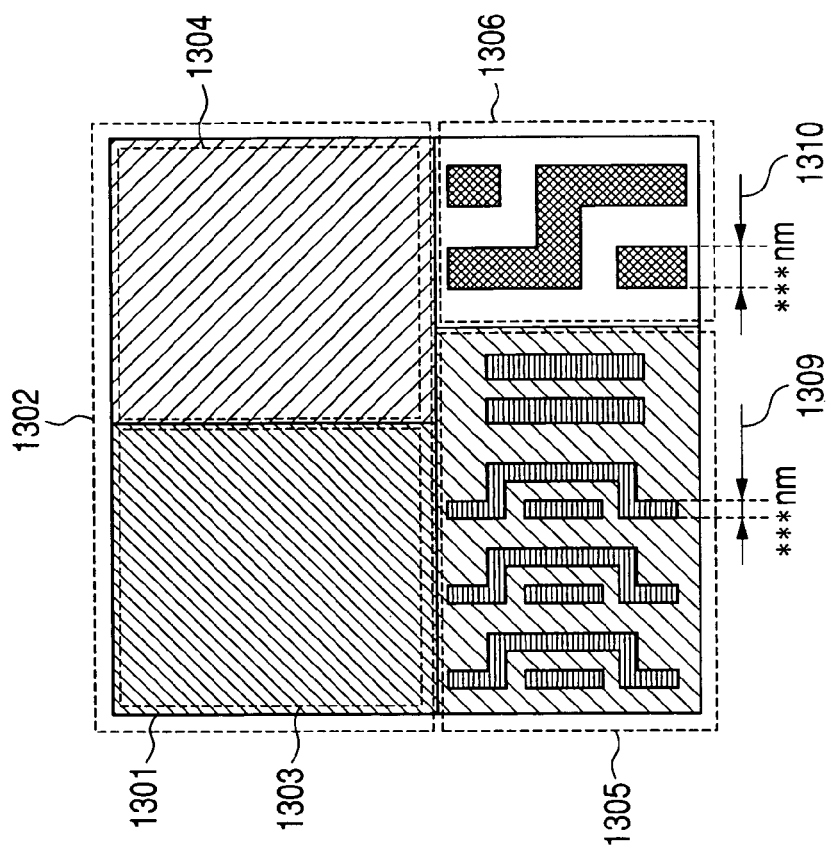

Color-coding an underlayer of the pattern, not the inside thereof, or as shown in FIG. 19B (*a*), color-coding all regions such as regions 1303 to 1306 are usable as variations of color-coding methods. It is also possible, as shown in FIG. 19B (*b*), to combine such a color-coding method as in FIGS. 19A (*a*), (*b*), and such a color-coding method as in FIG. 19B (*b*). In this combination of color-coding methods, a region (e.g., 1305, 1306) that includes a shape of a desired pattern to be noted can have only the inside of the pattern color-coded, and other regions (e.g., 1303, 1304) can each be color-coded in a specific color. In addition, a region range can be definitely displayed by color-coding an underlayer with a desired brightness value, as in the region 1305.

A description mainly of line width has been described above as attribute information. However, it is possible to color-code the patterns or underlayers that each include, as attribute information, a minimum inter-pattern distance, or pattern roughness/fineness levels based on the minimum inter-pattern distance or the like, or pattern shapes, or design margins (e.g., shifts in position of, the amounts of deformation of, or other factors of patterns capable of maintaining a connected relationship with respect to contact holes in upper or lower layers), and are based on the above attribute information. Region color-coding by region segmentation based on the above attributes is also possible. In addition, although the color-coding brightness value can be given arbitrarily, it is possible to select a brightness value close to that of an actual SEM image.

2.3: Pattern Shape Deformation

Next, examples concerning the pattern shape deformation step S63 executed by the pattern shape deformation processor 12513 will be described using FIGS. 20 to 24. The CAD image 608 (605) that has gone through the pattern shape deformation step is stored into the CAD image memory 1253 or temporarily stored into the storage device 127. CAD data 601 such as design data or resist mask data is likely to result in a pattern shape different from that actually generated on the wafer. Therefore, any differences between the pattern in the CAD image 608 (605) that has been generated from the CAD data 601, and the pattern in the SEM image obtained by imaging the pattern generated on the wafer, may cause inconvenience during matching between both patterns or during CAD image-based processing similar to SEM image processing. Accordingly, a method of approximating the pattern in the CAD image 608 to the pattern in the SEM image will be described below.

2.3.1: Contour Shape Deformation 2.3.1.1: Pattern Deformation Method Using a Photolithographic Simulator Approximation of the pattern in the CAD image 608 generated from the CAD data 601, to the pattern in the SEM image obtained by imaging the pattern generated on the wafer, can be accomplished by simulating the pattern formation in a semiconductor process by use of the CAD data 601.

This method is described below using the process flow chart shown in FIG. 20. First, in step S631, on the basis of CAD data 1401 of the mask stored within the CAD data file 507, the pattern shape deformation processing section 12513 uses image-forming simulation to consider a diffraction phenomenon and others of light and calculate the luminous intensity distribution optically transferred onto a resist film present on the wafer. Input parameters for the image-forming simulation include the CAD data 1401 and image-forming exposure conditions 1407 (wavelength $\lambda$ of the light, numerical aperture NA, the kind of photomask, exposure time, and others).

Next, in step S632, on the basis of the above-calculated luminous intensity distribution, the pattern shape deformation processing section 12513 conducts developing simulation to compute the process parameters that dissolve the resist film of the wafer, then to calculate the shape of the resist pattern 1404 formed on the wafer, and to store calculation results into the storage device 127, for example. Input parameters for the developing simulation include the calculated luminous intensity distribution, developing process parameters 1408, namely, resist information (composition ratio of the material used, thickness, transmittance, absorption energy, and others), developing agent information (developing rate coefficient, developing time, and others), and underlayer information (thickness, refractivity, absorption coefficient, and others).

Next, in step S633, the pattern shape deformation processing section 12513 conducts electron beam simulation to calculate the above-calculated resist pattern CAD image data (data of an image close to the pattern shape in the SEM image obtained by imaging the pattern) and then to store calculation results into the CAD image memory 1253. During the electron beam simulation, for example, parameters relating to the process of intra-substance electron scattering of the electron incident on the resist pattern are computed using the Monte Carlo method, and strength of the secondary electrons emitted from the substance surface and detected by SEM is calculated. The above two types of arithmetic operations are repeated at various points on the resist pattern, whereby the SEM image data that has been obtained by imaging the resist pattern are calculated. Input parameters 1409 on the electron beam simulation include the above-calculated resist pattern shape, SEM measuring conditions (acceleration voltage, probe current, and others), and material information (composition ratio, thickness, and others). It is possible, by such processing, to simulate the pattern formation in the semiconductor process by use of the CAD data 1401 of the mask, and calculate a shape close to the pattern shape in the SEM image obtained by imaging the pattern generated on the wafer.

In the foregoing process flow shown in FIG. 20, however, there are problems such as increased process costs and difficulty with process parameter setup. The following describes alternative techniques for solving these problems.

Figure 21C:
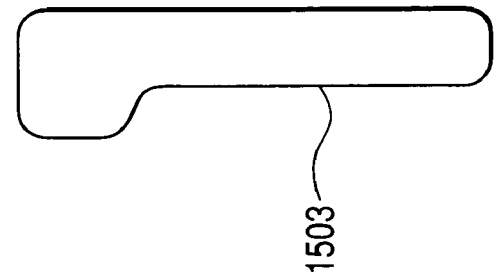
FIG. 21C is a diagram showing a contour shape of a luminous intensity distribution of a sliced surface obtained by slicing the luminous intensity distribution of FIG. 21B at a luminous intensity level "th"
Figure 21B:
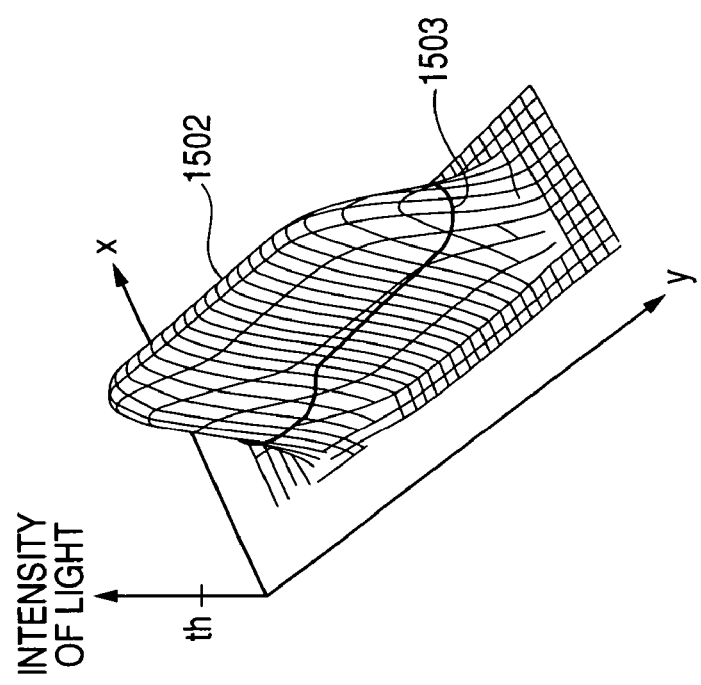
FIG. 21B is a diagram that shows simulation results on an on-wafer luminous intensity distribution obtained during the light exposure that uses the mask pattern of FIG. 21A.
Figure 21A:
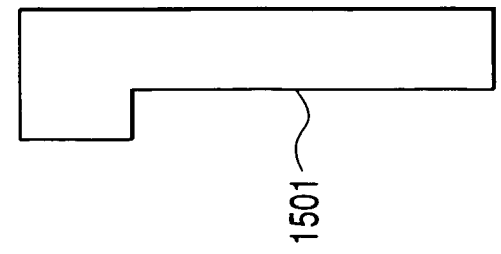
FIG. 21A is a diagram showing a mask pattern.
Figures 22A, 22B, 22C, 22D:
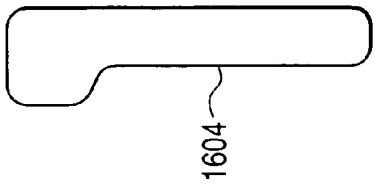
FIG. 22A is a diagram that shows CAD data of a mask.
FIG. 22B is a diagram of a photomask pattern to which partial mask removal (unmasking) information is appended.
FIG. 22C is a diagram showing a multivalued image obtained by smoothing the photomask pattern of FIG. 22B.
FIG. 22D is a diagram that shows binarization results on the multivalued image of FIG. 22C.

2.3.1.2: Simplified Method of Estimating the Pattern Shape from the Luminous Intensity Distribution Parameter setup becomes unnecessary by using the technique shown in FIGS. 21A to 21C, instead of the above-described developing simulation shown in FIG. 20. More specifically, the luminous intensity distribution 1502 in FIG. 21B, obtained from the mask pattern 1501 in FIG. 21A by the image simulation in step S631, is sliced using desired luminous intensity "th", and as shown in FIG. 21C, a contour shape 1503 of the luminous intensity distribution on that slice surface is calculated. The luminous intensity "th" for extracting the slice surface (hereinafter, "th" is called the slice level) is determined by changing the slice level "th" so that the contour shape of the luminous intensity distribution on the slice surface will be closest to a contour shape of a pattern present in the actual SEM image obtained by imaging the pattern on the wafer.

In the processing/control unit 115, during matching between the CAD image created by the CPU (CAD image creation unit) 1251 of the imaging recipe creation device 125, and the SEM image obtained by pattern imaging, the slice level "th" and the matching position are varied as described above. Matching will be complete when the CAD image that has been generated using the slice level "th", and the SEM image that has been obtained by pattern imaging best match in position with each other.

During the AP, FP, SP, BP, EP searches and/or other operations using the CAD image generated by the imaging recipe creation device 125, when the above SEM image is not to be acquired, the processing/control unit 115 can also use a previously learnt slice level "th" (e.g., based on learning with the SEM image acquired by imaging the pattern that has been exposed and developed under the same conditions). Alternatively, the user can give any slice level "th."

2.3.1.3: Pattern Deformation Method that Uses Smoothing

A simplified method of approximating the pattern in the CAD image 608 generated from the CAD data 601, to the pattern in the SEM image obtained by imaging the pattern generated on the wafer, is by providing the former pattern with image processing for reduced high-frequency pattern components. A method that uses Gaussian filtering is shown in FIGS. 22A to 22D as one such example. This method includes generating a photomask pattern 1602 with partial mask removal information added thereto, from CAD data 1601 of a mask, then conducting a smoothing process (e.g., Gaussian filtering) on the photomask pattern 1602, and generating a multivalued image 1603. Additionally, the generated multivalued image 1603 is binarized with a desired brightness value, and the resulting contour shape 1604 is calculated. The brightness value used for the binarization is determined in the same manner as that of the slice level "th". This method, unlike a simulator-based one, has advantages that it requires no setup of process parameters or other parameters and calculation costs are low.

2.3.1.4: Pattern Deformation Method that Uses Profile Deformation of Corners

Figures 23A, 23B, 23C:
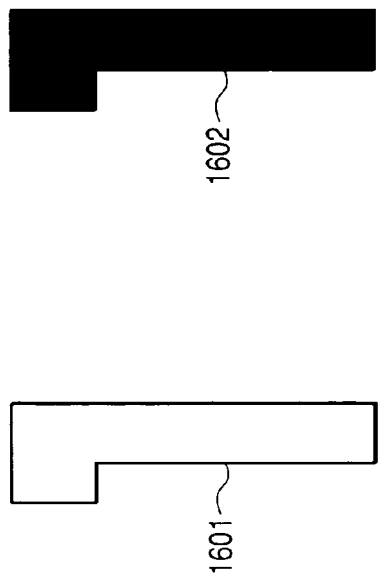
FIG. 23A is a diagram that shows CAD data.
FIG. 23B is a diagram showing a shape obtained by cutting several tens of percent of line width at corners of the pattern of FIG. 23A.
FIG. 23C is a diagram showing a shape obtained by replacing the corner section of the pattern of FIG. 23A with sectors.

Another simplified method of approximating the pattern in the CAD image 608 generated from the CAD data 601, to the pattern in the SEM image obtained by imaging the pattern generated on the wafer, is by providing the former pattern with image processing for deformed corners of the pattern. This method deforms a corner shape of a pattern in CAD data 1701 selectively to obtain a shape close to an actual pattern shape in a SEM image, as shown in FIGS. 23A to 23C. For example, generating a shape 1702 having several tens of percent of line width cut at corners of a pattern contour shape, or generating a shape 1703 having the above corners replaced with sectors makes it possible to obtain approximately a pattern shape in the SEM image acquired by imaging the pattern generated on the wafer.

The methods of deforming the pattern shape by smoothing or by cutting corners are only examples. Simplified processing with these methods make it possible to obtain an approximated CAD image 608 close to an actual SEM image, with minimum setup of process parameters and at low process costs. Better results can be obtained during processing by the processing/control unit 115, such as matching between a CAD image and a SEM image.

2.3.2: Edge Effect

For a SEM image, very high brightness values are occasionally detected at, for example, boundary lines of step-shaped sections of the image. This characteristic phenomenon of the SEM image is called the edge effect. The edge effect arises from the fact that the number of secondary electrons excited by electron beam irradiation and jumping outward from the surface layer of the sample differs between the planar sections and step-shaped sections of the SEM image. The characteristic brightness pattern of the SEM image caused by the edge effect is not represented in conventional CAD images. Similarly to the foregoing pattern shape deformation, however, CAD images closer to SEM images can be obtained.

FIG. 24A shows a CAD image 1801 expressed by line drawing of a pattern 1802. A brightness profile between sections A and B of the above pattern is shown as reference numeral 1803. Since contour lines of the pattern are usually drawn in pixel units, a width 1804 of the contour lines drawn in black in the figure is 1 pixel. In contrast to this, FIG. 24B shows a CAD image 1805 having a boundary drawn with the edge effect taken into account. In this figure, both pattern interior 1807 and underlayers are color-coded at the same time. In the present invention, line width of a boundary section 1806 of the pattern is expanded to a line width 1809 of several pixels, as shown by C-D brightness profile 1808. Additionally, selectively providing a smoothing filter in the entire CAD image or near a pattern boundary section thereof makes it possible to obtain a profile closer to an actual SEM image profile, as shown by C-D brightness profile 1810.

2.4: Variation of CAD Image Generation (Arbitrary Combination of the Methods Described in Items 2.1 to 2.3)

Methods of generating a CAD image 605 from CAD data 601 have heretofore been described. When the CAD image 605 is generated, however, it is possible to combine part or all of the image-quantizing width determining step S61, the attributes-based brightness information providing step S62, or the pattern deformation step S63.

In addition, it is desirable that the brightness levels or pattern shapes in an SEM image, obtained dependently on various conditions such as exposure conditions (image-forming exposure conditions and developing process conditions included) and image acquisition conditions (imaging magnification and image quality-related factors included), should differ and that the brightness levels or pattern shapes obtained in an associated CAD image 605 should resemble those of the SEM image. In order to respond to these variations of brightness or shape, appropriate parameters are desirably assigned when such changes in CAD image-generating parameters (image-quantizing width, brightness, and shape deformation) can be predicted in, for example, the imaging recipe creation device 125 beforehand. If the prediction is difficult, a plurality of CAD images should be created by combining arbitrary different parameters. Changes in SEM image state can then be flexibly accommodated by, during, for example, processing such as matching to the SEM image by the processing/control unit 115, conducting sequential matching operations using the plural CAD images created by the imaging recipe creation device 125, and adopting the CAD image having the highest correlation.

3: Application Using a CAD Image

EXAMPLE OF UTILIZING A CAD IMAGE

Various kinds of analyses (data viewing, image processing) in the SEM apparatus or equivalent that uses, for example, a CAD image created by the imaging recipe creation device 125, will be described hereunder.

According to a method of generating a CAD image according to the present invention, an appropriate image size that does not collapse a pattern-of-interest having an arbitrary attribute(s) can be determined during GUI-based display on a display unit or the like, during data viewing, or during arbitrary image processing. Also, the above arbitrary attribute(s) can be made visible in the CAD image, or a process that incorporates the attribute(s) can be conducted during arbitrary image processing. In addition, during data viewing or arbitrary image processing, analyses equivalent to those of the SEM image acquired from an actual pattern can be conducted by, for example, adding exposed-pattern deformation from design data or adding the edge effect or other changes in SEM signal state. Above arbitrary image processing includes a process step such as determining AP, FP, SP, BP, EP coordinates or image sizes (field sizes) and other imaging conditions, or registering a CAD image as an AP, FP, SP, BP, or EP template, or matching the CAD image and the SEM image and measuring any differences in coordinate position offsets between both images or in pattern shape therebetween. Automating a part or all of these process steps improves an automation ratio of the entire process flow from EP setup on the wafer to SEM-based image acquisition, dimension measurement/OPC shape evaluation, and feedback into process data.

In addition, the minimum line widths or minimum inter-pattern distances or reference pattern widths in each pattern or in a plurality of in-field patterns are effective not only during generation of a CAD image, but also determination of process parameters in arbitrary image processing that uses the CAD image. In other words, for example, when AP, FP, BP, EP is determined from any CAD image, a smoothing filter size can be determined based on line width in order to blur pattern being not more than the line width that wants to be noted. Furthermore, during such processing as described above, it is considered processing sequences that a desired input CAD image may be generated with the image-quantizing width for saving a reference pattern width that wants to be noted during any analytical operation, or a CAD image is generated with general-purpose image-quantizing width (for example, image-quantizing width at which all patterns will be saved) and then a desired input CAD image may be generated by repeating the quantization for the CAD image with any image-quantizing width according to an analytical content conducted or obtained thereafter, or a desired input CAD image may be generated by processing a CAD image by using appropriate process parameters (such as a smoothing parameter).

4: GUI Display and File Output 4.1: GUI Display

Figure 25A:
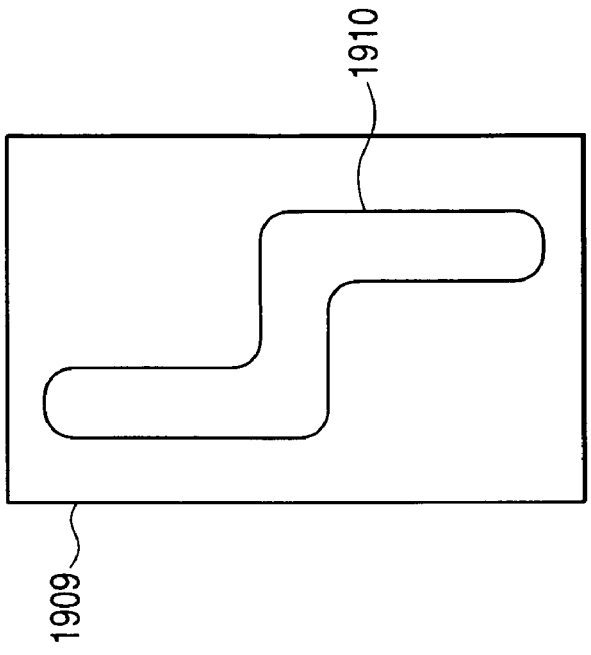
FIG. 25A is a diagram showing an example of a GUI for displaying a CAD image, the diagram being an overlapped representation of design data and a CAD image drawn allowing for an edge effect of a boundary of a pattern.
Figure 25B:
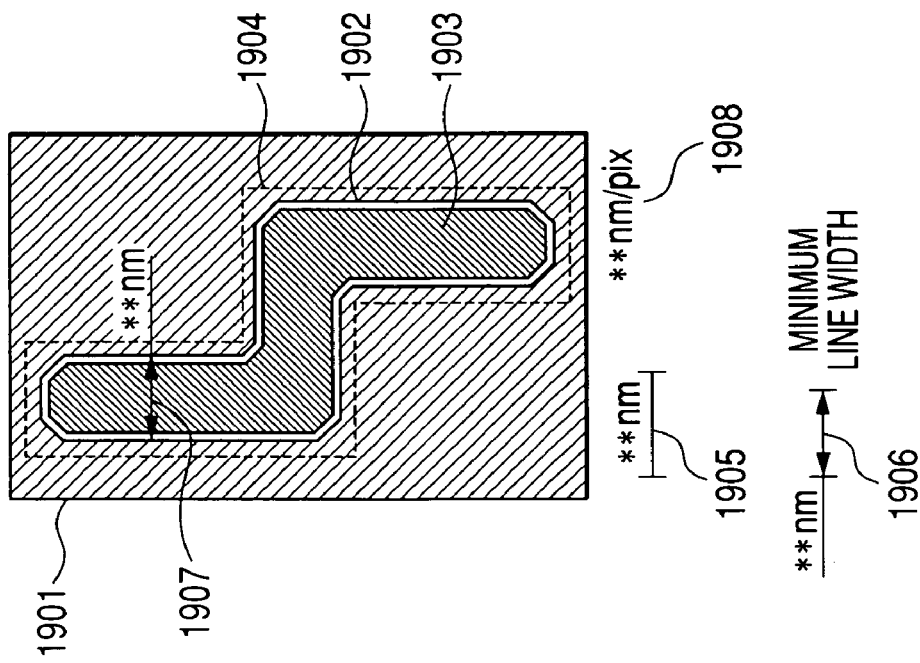
FIG. 25B is a diagram showing another example of a GUI for displaying a CAD image, the diagram being a representation of a SEM image disposed next to the CAD image and design data of FIG. 25A.

A description will be given of a method in which the CAD image that has been created according to the present invention is displayed in GUI (Graphic User Interface) screen mode of the display unit 116, 126. The above CAD image can be displayed in GUI screen mode, at which time, a plurality of images each different in conditions can be simultaneously displayed next to one another or in overlapped form, depending on particular needs. The above conditions include a part or all of a difference in magnification or a difference in image type (SEM image or CAD image) or differences in CAD image generating scheme (differences in the attributes emphasized). An example in which a CAD image 1901 (having a CAD pattern 1903 whose contour shape is approximated to a SEM image shape) and original related design data 1904 (shown with a dotted line) are displayed in overlapped form with a SEM image 1909 further displayed next to the overlapped display is shown in FIG. 25 as an example of the above image display method. The SEM image 1909 can either have its as-acquired SEM image displayed as it is, or have an internal pattern 1910 of the image displayed linearly by processing such as contour extraction. In addition, a scale 1905, minimum line width 1906 (or 1907), and an actual size/pixel ratio 1908 can each be displayed as an analog or digital indicator in an overlapped or side-by-side arranged format on the above display. The scale 1905 indicates how long in the CAD image an arbitrary unit dimension in full size is. For example, the scale 1905 makes a scale indication of the length in an image of a 100-nm full size.

The above minimum line width 1906 make a scale indication or a numerical value indication of the minimum line width of a pattern, or patterns (pattern group), within the image, and sections with a line width equivalent to the minimum line width can also be displayed as 1097. Typical values for each pattern or within a display range can be displayed as the display of the minimum line width 1906 and 1907, and these typical values can be simultaneously displayed as, for example, typical line widths 1307 to 1310 in FIGS. 19A and 19B. In addition, although the above GUI display method has been described taking the minimum line width as an example, the minimum inter-pattern distance or reference pattern width or any attribute value can be displayed as a scale or a brightness value or digitally (a numerical value) on an associated pattern, or at any location, in GUI screen mode.

4.2: File Output

Figure 5B:
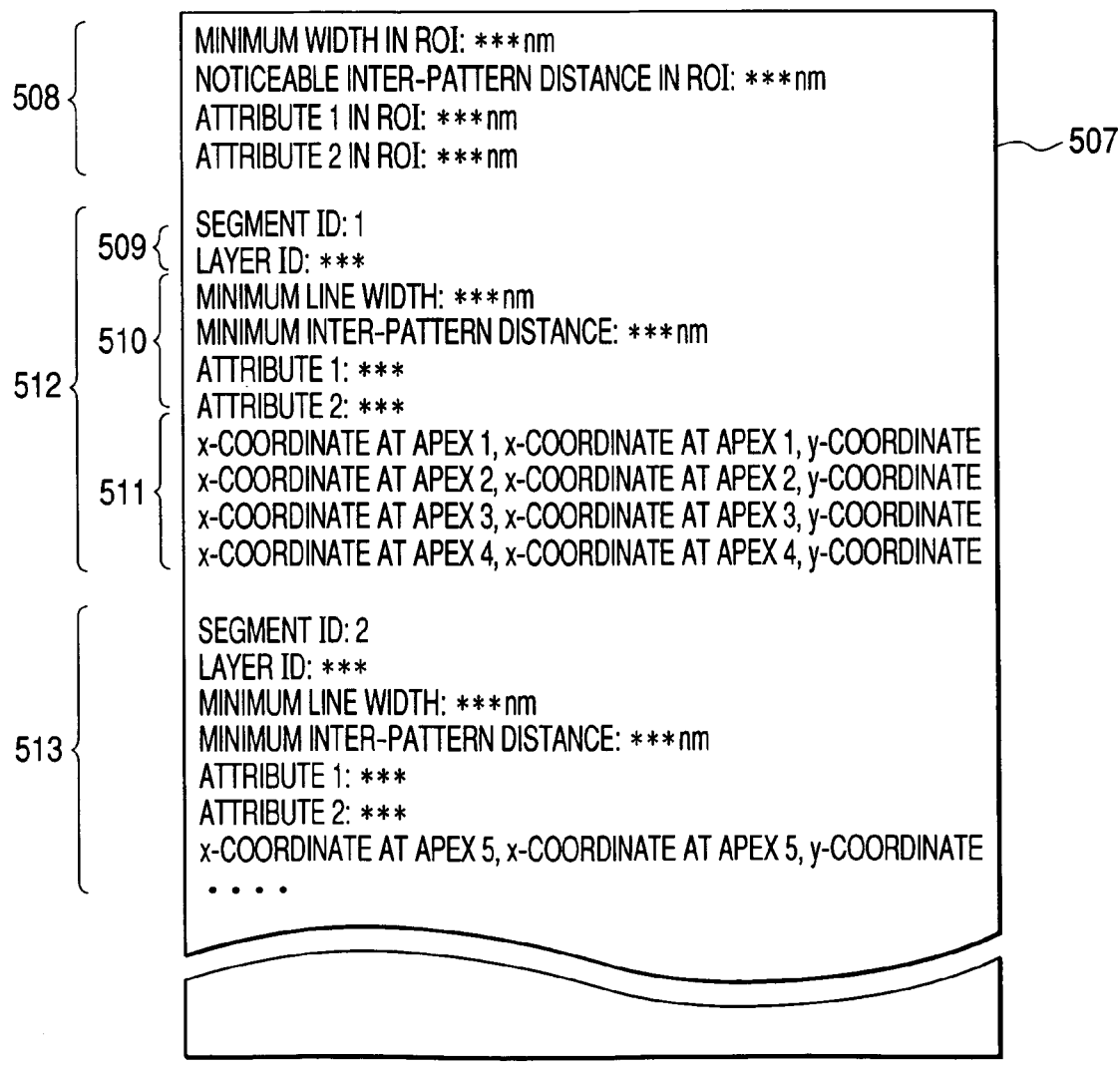
FIG. 5B is a diagram showing an example of a file format of the layout data.

A numerical representation of the minimum line width or minimum inter-pattern distance or various attribute information in the present invention can be written into a CAD data file or other files, for management. A method of integrated management with the CAD data file 507 will be described as an example using FIG. 5B. FIG. 5B shows an example of a file format in which the CAD data in FIG. 5A is written. At the top layer 504 shown therein, three patterns 501 to 503, are shown and the pattern 501 includes four apexes P1 to P4. Segment information 511 that identifies a contour of a pattern shape represented by x- and y-coordinates of the apexes P1 to P4, and layer information 509 such as 504 to 506 are generally written for each pattern in the CAD data file 507 (the above two kinds of information are listed as 512, 513, for each pattern). The x- and y-coordinates are expressed in any reference coordinate system 500 and have a unit such as nanometers.

In the present invention, in addition to the above, part or all of a numerical representation of the minimum line widths or minimum inter-pattern distances or various attribute information for each pattern can be expressed as 510, for example. Additionally, part or all of typical values or distribution information in any region (including extraction region ROI) of the minimum line widths or minimum inter-pattern distances or desired pattern widths or various attribute information for each pattern can be written into a file header 508. The above attribute information includes part or all of mask pattern partial removal information (i.e., whether a particular location at a resist mask is a resist-photosensitizing location), or the kind of sample's material at an associated position, or manufacturing processes, or pattern shapes, or roughness/fineness levels of the patterns, or design margins.

In addition, the CAD image generating method, analytical method, display method, or file management method described in the present invention can be utilized not only in SEM apparatuses, but also optical microscope apparatuses, scanning probe microscopes (hereinafter, called SPMs), or the like. That is to say, setup of AP and EP may be required in the above optical microscope apparatuses or SPMs as well, and in an SPM, for instance, the SEM images heretofore described will be the depth information acquired by the SPM, or will be image conversion results on the depth information (depth data will be converted into brightness data of images).

As described above, in embodiments of the apparatus or method for creating an imaging recipe in a SEM apparatus, an optical microscope apparatus, or an SPM apparatus (or the like) according to the present embodiment, at least the following six advantageous effects can be obtained:

(1) It is possible, by determining image-quantizing width based on the pattern width that should be noted determined by the minimum line width or minimum inter-pattern distance of patterns, to determine appropriate image-quantizing width for the complexity of the pattern to be noted and obtain processing results at high speed and accurately in various image-processing.

(2) Any differences in, for example, SEM signal quantity due to the differences in attributes that are detected in, for example, an actual SEM image, can be represented in a CAD image by representing any differences in mask pattern partial removal information, material information of the sample, information on processing states, or other attribute information, as different brightness values, and assigning these values to the CAD image. On the result of assigning these values to the CAD image, in AP template searches etc. it is possible to conduct AP template searches in consideration of for example, SEM signal quantity that appears in feature due to the above differences in attributes. In addition, there is an advantage that the template searches improve in stability with respect to conventional linear images or that highly accurate relationship can be established during matching between the CAD image and, for example, the SEM image.

(3) Provision of image processing which deforms the pattern profile written in CAD data makes it possible for the deformation of the pattern on, for example, a SEM image, due to any differences in exposure process conditions or image acquisition conditions, or the like, to be represented in a CAD image as well. Improved accuracy in matching between both images is thus anticipated.

(4) Changes in SEM image state, for example, can be flexibly accommodated by creating beforehand a plurality of CAD images each different in part or all of image-quantizing width, a brightness providing method based on attributes, or a shape deformation method and level.

(5) For example, SEM image acquisition only for determining the coordinates of the imaging points including a part of AP, FP, SP, BP, or EP, or all thereof, and for determining image acquisition conditions becomes unnecessary by using the CAD image created according to the above-mentioned image-quantizing width, brightness providing method, or shape deformation method. That is to say, the coordinates of the above imaging points, and image acquisition conditions can be determined from the CAD image, and the CAD image itself can be registered as a template. For example, when using a SEM apparatus to actually observe any one of the above imaging points, it is necessary to match a CAD image (template) whose coordinates are known, and a SEM image, for example, and estimate the imaging position. According to the present embodiment, however, both images can be matched very accurately as described in item (3) above.

(6) Automatic determination of the imaging points and the like from a CAD image is possible, for which reason, the imaging recipe creation that has conventionally been manually conducted can be implemented more easily and at higher speed.

The present invention can be applied to a SEM apparatus such as a CD-SEM.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes that come within the meaning and range of equivalency of the claims are therefore intended to be embraced therein.

What is claimed is:

1. An apparatus for creating an imaging recipe to observe, by using a scanning electron microscope, a semiconductor pattern formed on a sample, the apparatus comprising:

a CAD data file within which is input and stored CAD data that contains layout information of the pattern formed on the sample, the CAD data being in the form of segment information represented by X and Y coordinates of apexes of the pattern and layer information;

a CAD image creation unit which creates a CAD image by converting the stored CAD data within the CAD data file into an image format; and an imaging recipe creation device which creates the imaging recipe by using the CAD image created by the CAD image creation unit.

2. The apparatus according to claim 1, wherein the CAD image creation unit includes an image-quantizing width determining section which creates the CAD image by converting the CAD data into an image using image-quantizing width determined based on a pattern width of a predetermined reference pattern.

3. The apparatus according to claim 2, wherein, in the image-quantizing width determining section, the pattern width of the predetermined reference pattern includes a minimum line width or minimum inter-pattern distance of the predetermined reference pattern.

4. The apparatus according to claim 3, wherein, in the image-quantizing width determining section, the minimum line width or minimum inter-pattern distance of the predetermined reference pattern is calculated from the CAD data.

5. The apparatus according to claim 1, wherein the CAD image creation unit includes a brightness information providing section which creates the CAD image by converting the CAD data into a multivalued image having various attributes assigned as brightness data.

6. The apparatus according to claim 5, wherein, in the brightness information providing section, the attributes include any one of, or a plurality of, or all of, mask pattern partial removal information, material or manufacturing process information, layer information, shape information on the pattern, a roughness/fineness level of the pattern, and design margins.

7. The apparatus according to claim 5, wherein: in the brightness information providing section, the various attributes include mask pattern partial removal information; and the CAD image creation unit includes a pattern shape deformation processing section which creates the CAD image by conducting a deforming process on the pattern shape written in the CAD data.

8. The apparatus according to claim 7, wherein, in the pattern shape deformation processing section, the deforming process includes image processing which is conducted to round the pattern shape at a corner section thereof or/and change the pattern in width.

9. The apparatus according to claim 1, wherein the CAD image creation unit includes:
an image-quantizing width determination section which creates the CAD image by converting the CAD data into an image using the image-quantizing width determined based on a pattern width of a predetermined reference pattern;
a brightness information providing section which creates the CAD image by converting the CAD data into a multivalued image having various attributes assigned as brightness data; and
a pattern shape deformation processing section which creates the CAD image by conducting a deforming process on the pattern shape written in the CAD data.

10. The apparatus according to claim 1, wherein the imaging recipe created by the imaging recipe creation device includes coordinates of an imaging point, and an image template at the coordinates, or imaging conditions for SEM observation.

11. The apparatus according to claim 10, wherein the imaging point includes any one of, or a plurality of, or all of, an addressing point, a focusing point, a stigmatism control point, and a brightness and contrast control point, and an evaluation point.

12. A method for creating an imaging recipe to observe, by using a scanning electron microscope, a semiconductor pattern formed on a sample, the method comprising the steps of:
transferring CAD data in which layout information of the semiconductor pattern is written, to a CAD data file, the CAD data being in the form of segment information represented by X and Y coordinates of apexes of the pattern and layer information;
creating a CAD image by conducting an image conversion based on the CAD data transferred to the CAD data file in the transferring step;
creating the imaging recipe by using the CAD image created in the CAD image creating step; and
outputting the imaging receipt to a display unit through a graphic user interface.

13. The method according to claim 12, wherein the CAD image creating step further includes:
an image-quantizing width determining step that creates the CAD image by converting the CAD data into an image using the image-quantizing width determined based on a reference pattern width;
a brightness information providing step that creates the CAD image by converting the CAD data into a multivalued image having various attributes assigned as brightness data; and
a pattern shape deformation processing step that creates the CAD image by conducting a deforming process on the pattern shape written in the CAD data.

14. The method according to claim 12, wherein the imaging recipe created in the step of creating the imaging recipe includes coordinates of an imaging point, and an image template at the coordinates, or imaging conditions for SEM observation.

15. An apparatus for evaluating a shape of a semiconductor pattern formed on a sample, the apparatus comprising:
an observation device which observes the pattern formed on the sample, through a scanning electron microscope in accordance with an imaging recipe;
an imaging recipe creation device which creates the imaging recipe for imaging with the scanning electron microscope to observe the pattern by use of the observation device; and
an evaluation device which evaluates a shape of the pattern on the basis of the results obtained during the observation by the observation device;
wherein the imaging recipe creation device includes:
a CAD data file within which is input and stored the CAD data that contains layout information of the pattern formed on the sample, the CAD data being in the form of segment information represented by X and Y coordinates of apexes of the pattern and layer information;
a CAD image creation unit which creates a CAD image by converting the stored CAD data within the CAD data file into an image format; and
an imaging recipe creation unit which creates the imaging recipe by using the CAD image created by the CAD image creation unit.

* * * * *